(12) United States Patent
Sandstrom et al.

(10) Patent No.: US 12,300,561 B2
(45) Date of Patent: May 13, 2025

(54) FULLY MOLDED STRUCTURE WITH MULTI-HEIGHT COMPONENTS COMPRISING BACKSIDE CONDUCTIVE MATERIAL AND METHOD FOR MAKING THE SAME

(71) Applicant: Deca Technologies USA, Inc., Tempe, AZ (US)

(72) Inventors: Clifford Sandstrom, Richfield, MN (US); Paul R. Hoffman, San Diego, CA (US); Robin Davis, Vancouver, WA (US); Timothy L. Olson, Phoenix, AZ (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 18/744,482

(22) Filed: Jun. 14, 2024

(65) Prior Publication Data
US 2024/0421017 A1    Dec. 19, 2024

Related U.S. Application Data

(60) Provisional application No. 63/508,731, filed on Jun. 16, 2023.

(51) Int. Cl.
| | | |
|---|---|---|
| *H01L 23/31* | (2006.01) | |
| *H01L 23/00* | (2006.01) | |
| *H01L 23/498* | (2006.01) | |
| *H01L 25/065* | (2023.01) | |

(52) U.S. Cl.
CPC .... *H01L 23/3128* (2013.01); *H01L 23/49822* (2013.01); *H01L 23/49838* (2013.01); *H01L 24/08* (2013.01); *H01L 24/97* (2013.01); *H01L 25/0655* (2013.01); *H01L 2224/08145* (2013.01); *H01L 2224/08225* (2013.01); *H01L 2224/97* (2013.01); *H01L 2924/01029* (2013.01); *H01L 2924/1427* (2013.01); *H01L 2924/1431* (2013.01); *H01L 2924/15311* (2013.01); *H01L 2924/182* (2013.01)

(58) Field of Classification Search
CPC ........... H01L 23/3128; H01L 23/49822; H01L 23/49838; H01L 24/08; H01L 24/97; H01L 25/0655
See application file for complete search history.

(56) References Cited

U.S. PATENT DOCUMENTS

| | | | |
|---|---|---|---|
| 2011/0304016 A1* | 12/2011 | Nakamura | H05K 3/284 257/532 |
| 2014/0061944 A1* | 3/2014 | Lin | H01L 24/96 257/774 |
| 2014/0335658 A1* | 11/2014 | Scanlan | H01L 24/96 438/113 |
| 2015/0187710 A1* | 7/2015 | Scanlan | H01L 24/20 257/777 |

(Continued)

*Primary Examiner* — Nathan W Ha
(74) *Attorney, Agent, or Firm* — Bryce W. Burnham; Booth Udall Fuller, PLC

(57) ABSTRACT

The disclosure concerns devices and methods of forming an electronic assembly or semiconductor assembly, such as fully molded structures, comprising at least two components of a same or differing heights, which may further comprise a backside conductive material. The backside conductive material may be a good thermal conductor, a good electrical conductor, or both.

21 Claims, 15 Drawing Sheets

(56) References Cited

U.S. PATENT DOCUMENTS

| | | | |
|---|---|---|---|
| 2017/0012009 A1* | 1/2017 | Olson | H01L 24/03 |
| 2019/0326255 A1* | 10/2019 | Olson | H01L 21/78 |
| 2023/0010707 A1* | 1/2023 | Wang | H01L 25/0655 |
| 2023/0187363 A1* | 6/2023 | Lin | H01L 25/105 |
| | | | 257/668 |
| 2023/0411174 A1* | 12/2023 | Su | H01L 21/4857 |
| 2023/0411263 A1* | 12/2023 | Park | H01L 23/49827 |
| 2024/0071939 A1* | 2/2024 | Cheng | H01L 23/3121 |
| 2024/0071998 A1* | 2/2024 | Huang | H01L 25/105 |

* cited by examiner

FULLY MOLDED STRUCTURE WITH MULTI-HEIGHT COMPONENTS COMPRISING BACKSIDE CONDUCTIVE MATERIAL AND METHOD FOR MAKING THE SAME

CROSS-REFERENCE TO RELATED APPLICATIONS

This application claims the benefit of U.S. provisional patent application 63/508,731 filed Jun. 16, 2023 titled "Fully Molded Structure with Multi-Height Components Comprising Backside Conductive Material and Method for Making the Same," the entirety of the disclosure of which is hereby incorporated by this reference.

INCORPORATION BY REFERENCE

This disclosure hereby incorporates by reference the entirety of the disclosures of: (i) U.S. patent application Ser. No. 17/957,683 entitled "Quad Flat No-Lead (QFN) Package Without Leadframe and Direct Contact Interconnect Build-up Structure and Method for Making the Same" to Davis et al. that was filed on Sep. 30, 2022; (ii) U.S. Patent Application No. 63/347,516 entitled "Molded Direct Contact Interconnect Build-Up Structure Without Capture Pads" to Davis et al. that was filed on May 31, 2022; (iii) U.S. patent application Ser. No. 13/891,006, titled "Semiconductor Device and Method of Adaptive Patterning for Panelized Packaging," filed May 9, 2013, and issued as U.S. Pat. No. 9,196,509; (iv) U.S. patent application Ser. No. 13/893,117, titled "Adaptive Patterning for Panelized Packaging," filed May 13, 2013, and issued as U.S. Pat. No. 8,826,221; and (v) U.S. Patent Application No. 63/455,947 entitled "Quad Flat No-Lead (QFN) Package With Backside Thermally Conductive Material and Direct Contact Interconnect Build-Up Structure and Method For Making The Same, filed Mar. 30, 2023.

TECHNICAL FIELD

Embodiments of the present disclosure relate to the field of devices and methods of forming an electronic assembly or semiconductor assembly, such as fully molded structures comprising at least two components and backside conductive material. The disclosure also relates to electronic assemblies that are formed by the instant methods.

BACKGROUND

Semiconductor assemblies, devices, packages, substrates, and interposers are commonly found in modern electronic products. Production of semiconductor devices involves a multistep build-up of components.

SUMMARY

An opportunity exists for improved semiconductor assemblies, including applications for semiconductor manufacturing. Accordingly, in some aspects, the disclosure concerns a method of making an electronic assembly, including providing a temporary carrier, providing a first component with conductive studs coupled to a front surface of the first component and coupling the first component face down over the temporary carrier, the first component including a first thickness in a range of 10-300 micrometers (μm), providing a second component with conductive studs coupled to a front surface of the second component and coupling the second component face down over the temporary carrier, the second component including a second thickness greater than the first thickness, the second thickness being in a range of 10-800 μm, and disposing an encapsulant as a single layer of material over or around at least five surfaces of the first component, over or around at least five surfaces of the second component, and around at least a portion of the sidewalls of the conductive studs. The method comprising removing a portion of the encapsulant to expose a backside of the second component or the first component and the second component, and forming a conductive backside material including a thickness in a range of 1-1500 μm over at least a portion of one or more of a backside of the first component or over at least a portion of a backside of the second component. The conductive backside material provides one or more benefits to the first component or the second component, including heat dissipation, heat conduction, shielding, power, ground, electrical performance, electrical contact, electrical conduction, or structural reinforcement.

In some aspects, the disclosure concerns a method further including disposing the encapsulant over or around at least six surfaces of the first component or over or around at least five surfaces of the second component.

In some aspects, the disclosure concerns a method wherein the conductive backside material is at least one of a good electrical conductor, a good thermal conductor, or both, and includes one or more layers of metal, including: copper, aluminum, nickel, vanadium, silver, gold, brass, tungsten, molybdenum, other suitable metal, graphite, graphene, carbon nanotubes (CNTs), other suitable carbon materials, indium tin oxide (ITO), conductive polymers, diamond-like carbon (DLC), glass, and ceramics.

In some instances, the disclosure concerns a method wherein the conductive backside material includes a single portion that extends over at least a portion of the backside of the first component, at least a portion of the backside of the second component, and at least a portion of the single layer of encapsulant disposed around the first component and the second component.

In further instances, the disclosure concerns a method wherein the conductive backside material is applied after the encapsulant is disposed over or around at least four surfaces of the first component and over or around at least four surfaces of the second component, and after removing a portion of the encapsulant to expose a backside of the first component or the second component.

In other aspects, the disclosure concerns a method further including disposing the conductive backside material before the encapsulant is disposed over or around the first component and before the encapsulant is disposed over or around the second component.

In some instances, the disclosure concerns a method wherein the conductive backside material extends beyond one or more of a footprint of the first component and a footprint of the second component.

In further instances, the disclosure concerns a method wherein the first component includes a diode, a transistor, a field-effect transistor (FET), a junction field-effect transistor (JFET), a metal-oxide-semiconductor field-effect transistor (MOSFET), a bipolar junction transistor (BJT), an insulated-gate bipolar transistor (IGBT), a static induction transistor (SIT), a Schottky transistor; and the second component includes a processor, power management IC (PMIC) or logic device.

In some aspects, the disclosure concerns a method wherein the conductive backside material is configured to be electrically connected or electrically isolated from one or both of the first component and the second component.

In other aspects, the disclosure concerns a method of making an electronic assembly, including providing a temporary carrier, disposing a first component over the temporary carrier, the first component including a first thickness, disposing a second component over the temporary carrier, the second component including a second thickness, disposing an encapsulant as a single layer of material over or around at least four surfaces of the first component and over or around at least four surfaces of the second component, removing a portion of the encapsulant to expose a backside of the first component or the second component, and forming a conductive backside material disposed over at least a portion of one or more of a backside of the first component or over at least a portion of a backside of the second component.

In some instances, the disclosure concerns a method wherein at least one of the first component and the second component include conductive studs formed over a front surface of at least one of the first component and the second component.

In other instances, the disclosure concerns a method wherein at least one of the first component and the second component is disposed over the temporary carrier in a face up configuration or in a face down configuration.

In some aspects, the disclosure concerns a method further including forming conductive traces coupled with the first component and the second component, wherein at least a portion of the build-up interconnect structure comprises unit specific patterning such that a misalignment between the build-up interconnect structure and input output pads is less than a misalignment between an edge of the electronic assembly and the edge of one or more of the first component and the second component.

In some aspects, the disclosure concerns a method further including disposing the encapsulant over or around at least one of five surfaces of the first component and at least five surfaces of the second component, and six surfaces of the first component or six surfaces of the second component.

In some aspects, the disclosure concerns a method wherein the conductive backside material includes a single portion that extends over at least a portion of the backside of the first component, at least a portion of the backside of the second component, and at least a portion of the single layer of encapsulant disposed around the first component and the second component.

In some aspects, the disclosure concerns a method wherein the conductive backside material is applied after the encapsulant is disposed over or around at least four surfaces of the first component and over or around at least four surfaces of the second component and removed, and after removing a portion of the encapsulant, exposing a backside of the first component or the second component.

In other aspects, the disclosure concerns a method further including disposing the conductive backside material before the encapsulant is disposed over or around the first component and before the encapsulant is disposed over or around the second component.

In some instances, the disclosure concerns a method wherein the conductive backside material includes a first portion of the conductive backside material formed within a footprint of the first component, and a second portion of the conductive backside material formed within a footprint of the second component.

In some aspects, the disclosure concerns a method wherein: the first component includes a diode, a transistor, a power transistor, a FET, a JFET, a MOSFET, a BJT, an IGBT, a SIT, a Schottky transistor; and the second component includes a processor, a PMIC, or logic device.

In other aspects, the disclosure concerns a method wherein the conductive backside material is configured to be electrically connected or electrically isolated from one or both of the first component and the second component.

BRIEF DESCRIPTION OF THE DRAWINGS

Implementations will hereinafter be described in conjunction with the appended or included drawings, where like designations denote like elements.

FIGS. 7B and 7C illustrate plan views of the electronic assembly shown in FIG. 7A, showing how the unit specific pattern for the build-up interconnect structure can account for movement of the components.

DETAILED DESCRIPTION

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the figures are illustrative representations and are not necessarily drawn to scale.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

The foregoing and other aspects, features, and advantages will be apparent to those of ordinary skill in the art from the specification, drawings, and the claims.

The disclosure relates to electronic assemblies, semiconductor assemblies, packages, and devices. The electronic assemblies described herein comprise fully molded or encapsulated structures, LGA packages with an area array of contact pads, as well as "no-lead" packages such as quad flat no-lead (QFN), dual flat no-lead (DFN) or small-outline no-lead (SON) packages, as well as packages that are not "no-lead" packages—such as BGA packages.

In some embodiments, the electronic assemblies may physically and electrically connect to the surface of printed circuit boards (PCB's) or other substrates using surface mount technology, such as for coupling components, semiconductor components, semiconductor chips, or semiconductor die to the PCB, substrate, interposer, module, or other package or device. In other embodiments, such as higher end performance packages (e.g., CPUs) the electronic assemblies may not be connected or directly connected to a PCB, but instead may be physically and electrically connected to a socket or test socket for testing, operation, or both.

Figure 1A:
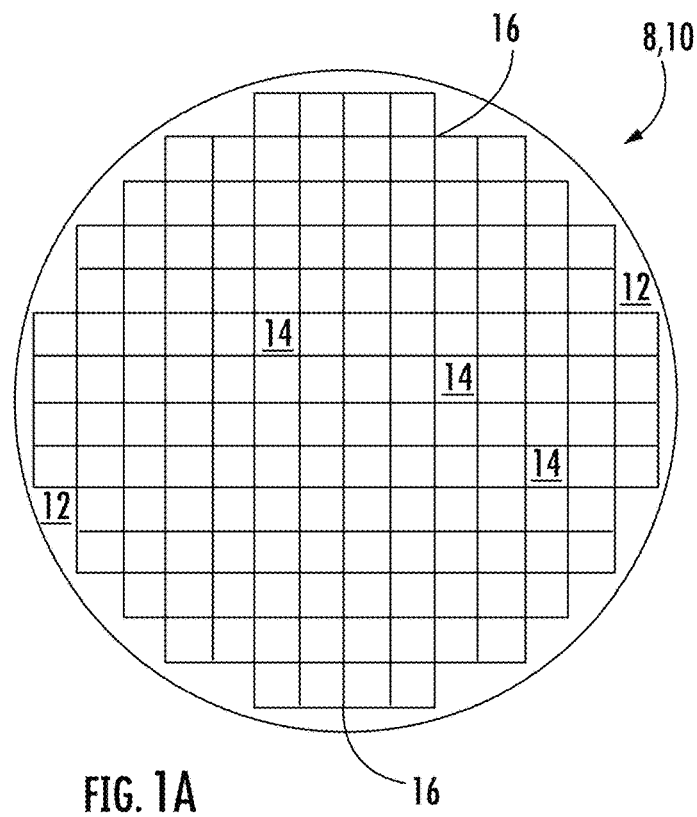
FIGS. 1A-1C are illustrations of components comprising electrical interconnects being singulated from a substrate or native wafer.

FIG. 1A shows a plan or top view of a substrate 8, which may comprise a semiconductor wafer or native wafer 10 with a base substrate material 12, such as, without limitation, silicon, silicon dioxide, silicon carbide, germanium, gallium arsenide, indium phosphide, gallium nitride, silicon nitride, silicon carbide, or other semiconductor material for the base material or structural support. A plurality of components or semiconductor components 14 can be formed on wafer 10 and can be separated by a non-active, inter-component wafer area or saw street 16 as described above. The saw street 16 can provide cutting areas to singulate the semiconductor wafer 10 into the individual component 14. In other instances, integrated passive devices (IPDs), either passive or active bridge chips, or other suitable devices that become embedded devices can be formed on a substrate 8 formed of glass, ceramic, or other suitable material for providing structural support for subsequent processing.

Each component 14 may comprise one or more active devices, passive devices, or both active devices and passive devices. In some instances, the component 14 may be formed without active and passive devices, and be used for transmission or routing, such as by comprising TSVs for vertical interconnect. For example, the component 14 may be formed as a bridge chip with only electrical routing and with copper studs of the semiconductor chip electrically connected or coupled with wiring, routing, or RDL to the bridge chip. The component 14 may also be only a dummy substrate with no electrical function, but rather act as structural element and may or may not include copper studs. In some embodiments, the component 14 may not include, and may be formed without, conductive studs.

The component 14 comprises semiconductor chips and semiconductor die that comprise a backside or back surface 18, an active layer 20 and a front surface 21 opposite the backside 18. In some instances, both the active layer 20 and the backside or back surface 18 of the component 14 may be active. In any event, the component contains one or more analog, or digital circuits, diodes, or transistors implemented as active devices, conductive layers, and dielectric layers formed within or on the chip and electrically interconnected according to the electrical design and function of the semiconductor chip and may comprise a processor or logic device. In some instances, passive devices may also be integrated as part of the semiconductor chip or semiconductor die. The component 14 may comprise circuits that may include one or more transistors, a FET, a JFET, a MOSFET, a BJT, an IGBT, a SIT, a Schottky transistor diodes, and other circuit elements formed within the chip substrate and close to the front surface 21 to implement analog circuits or digital circuits, such as DSP, ASIC, memory, or other circuits. Circuits may include RF circuits, LED, LCOS, CIS, transistor, optoelectronic, MEMS and the like. The component 14 may also contain IPDs such as inductors, capacitors, and resistors, for RF signal processing, digital or analog power line control or other functions. The component 14 may be formed on a native wafer. In some instances, a wafer level process may be used to produce many packages simultaneously on a carrier. In other instances, the package may be formed as part of a reconstituted wafer and may comprise multiple components or chips molded together.

Figure 1B:
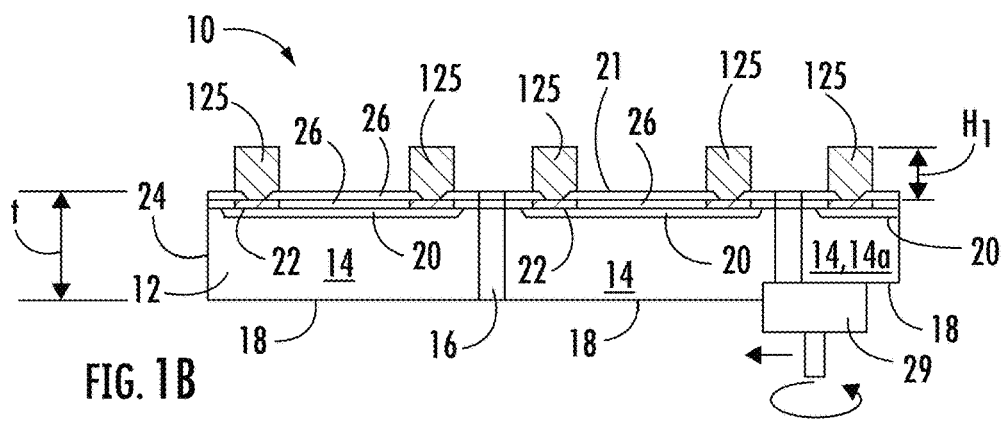

FIG. 1B illustrates a cross-sectional view of a portion of semiconductor wafer 10 having a thickness, t. Each component 14 is shown formed of base substrate material 12 and comprising a backside 18 or back surface, an active layer 20 and a front surface 21, opposite the backside 18.

An electrically conductive layer or contact pads 22 is formed over active layer 20 using PVD, CVD, electrolytic plating, electroless plating process, or other suitable metal deposition process. Conductive layer or contact pads 22 can be one or more layers of aluminum (Al), Titanium (Ti), copper (Cu), tin (Sn), nickel (Ni), gold (Au), palladium (Pd), silver (Ag), cobalt (Co), platinum (Pt), or other suitable electrically conductive material. Conductive layer 22 operates as contact pads or bond pads electrically coupled or connected to the circuits, transistors, or diodes in the semiconductor substrate 10 near front surface 21. The conductive layer can be formed as contact pads 22 disposed side-by-side a first distance from an edge 24 of component 14, as shown in FIG. 1B. Alternatively, conductive layer can be formed as contact pads 22 that are offset in multiple rows such that a first row of contact pads 22 is disposed a first distance from the edge 24 of the component 14, and a second row of contact pads 22 alternating with the first row is disposed a second distance from the edge 24 of the component 14. In other instances, the component 14 can comprise digital chips, analog chips, or RF chips (or other chips) with more than two rows of contact pads and may further comprise contact pads 22 over the whole surface of the chip that do not follow a full grid pattern. Other components 14 may have contact pads in an array over the whole surface of the chip.

FIG. 1B also illustrates the semiconductor substrate 10 and components 14 can undergo an optional grinding operation with grinder 29 to reduce a thickness of the semiconductor substrate 10 and component 14 to form a first component 14a having a thickness which has been reduced. Other methods to reduce the thickness of the semiconductor substrate 10 such as plasma etching or wet etching, as an alternative to, or in combination with, the optional grinding operation may be used and selection of the thinning process may depend on which base substrate material 12 the component 14 is made from.

FIG. 1B further shows one or more optional insulating, passivating, or dielectric layers 26 which may be conformally applied over active layer 20 and over conductive layer comprising contact pads 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), carbon-doped silicon dioxide, silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having suitable insulating and structural properties. When insulating layer 26 is formed over conductive layer comprising contact pads 22, openings are formed completely through insulating layer 26 to expose at least a portion of conductive layer for subsequent mechanical and electrical interconnection using contact pads 22. In alternate embodiments, insulating layer 26 includes a passivation layer and conductive layer comprising contact pads 22 may be formed atop the insulating layer 26. In such an embodiment, no openings in the insulating layer 26 over contact pads 22 would be necessary. In some embodiments, insulating layer 26 includes a passivation layer forming front surface 21. In other embodiments where the conductive layer comprising contact pads 22 is not covered by insulating layer 26, front surface 21 may comprise the conductive layer.

FIG. 1B shows conductive studs or electrical interconnect structures 125 can be formed as conductive studs, bumps, thick pads, columns, pillars, posts, or conductive studs and are disposed over, and coupled or connected to, contact pads 22. The conductive studs 125 can be formed directly on contact pads 22 using patterning and metal deposition processes such as screen printing, PVD, CVD, sputtering, electrolytic plating, electroless plating, evaporation, or other suitable metal deposition process. Alternately, conductive studs 125 may be formed in a position not vertically over the contact pads 22 and connected by RDL. Conductive studs 125 can be one or more layers of Al, Cu, Sn, Ni, Au, Ag, W, palladium (Pd), or other suitable electrically conductive material and can include one or more UBM layers. In an embodiment, a photoresist layer can be deposited over component 14 and contact pads 22. A portion of the photoresist layer can be exposed and removed by a developing or other suitable process. Electrically conductive studs 125 can then be formed as pillars or other structures as previously described in the removed portion of the photoresist and over contact pads 22 using a plating process. In some embodiments, copper may be used in a plating process. The photoresist layer and other appropriate layers, such as a seed layer, can be removed leaving conductive studs 125 that provide for subsequent mechanical and electrical interconnection and a standoff with respect to active layer 20 and insulating layer 26 if present. In some instances, the conductive studs 125 include a height, H1, in a range of 3-100 micrometers (μm), 5-50 μm, 10-40 μm, or about 25 μm. In some instances, the height $H_1$ of the conductive stud 125 may be less than 5 μm or less than 3 μm.

A conductive stud is a conductive interconnect structure that may have generally vertical sides and may be wider than it is tall, built-up on a substrate, such as over an active layer of a chip, polyimide, or mold compound. A conductive stud, though typically formed of the same materials as a pillar or post would be formed, may differ from a pillar or post, each of which may have a height greater than its width. A conductive stud, though it is commonly formed in a cylindrical shape, may be formed with a cross-sectional area that is circular, oval, octagonal, or as any polygonal or other shape and size. Another use for a conductive stud is as a dummy thermal conductive stud that is not electrically coupled to an active electrical circuit but is instead thermally coupled to a heat source of an active device to conduct or dissipate the heat to another structure, such as to a die pad on a surface of the component 14. The generally vertical sides of a conductive stud 125 are different from the sides shape that exists for a solder ball or a compressed or outwardly deformed solder ball that has generally rounded sides. The generally vertical nature of a conductive stud 125 comes from being formed in a structure that has been previously developed or etched, such as within openings in a photoresist layer, which will also be generally vertical, although it may comprise imperfections or irregularities in shape that result from the etching process, the photoresist material, or other materials and processes used. For example, developing or etching does not generally perfectly or uniformly remove the photoresist within the openings, and therefore forms imperfect, generally vertical openings for deposition of conductive materials for the conductive stud 125. The term "generally vertical" as used herein includes perfectly vertical and imperfectly vertical sides. A conductive stud is not a wire bond and is not solder.

Figure 1C:
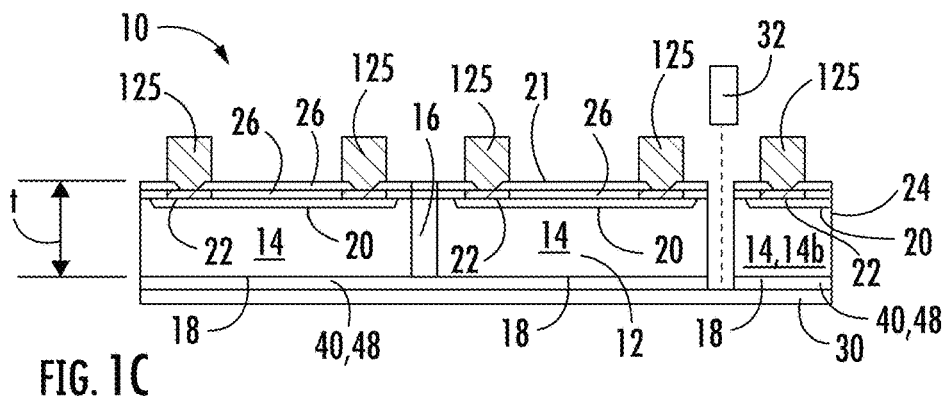

FIG. 1C further illustrates an optional adhesive or a (chip) die attach film (DAF) or material 30 may be attached to the back surface 18 of the semiconductor substrate or wafer 10, such as for subsequent mounting on a carrier. In some embodiments, semiconductor substrate or wafer 10 may comprise a pre-applied backside metal 48 applied as one-step of a wafer fabrication process. In other instances, a conductive backside material 40 may be applied according to the methods further disclosed herein. FIG. 1C also illustrates wafer 10 can be singulated with a saw or wafer cutting tool 32 into individual components 14 through saw streets 16 using a saw blade or laser cutting tool or plasma dicing tool or laser stealth dicing process or a scribe and break process. In some instances, the components 14, such as first components 14a, will have a thickness, t of between about 10 μm to about 300 μm for thin ground wafers, and about 10 μm to about 800 μm for thick ground wafers such as for second components 14b. In other instances, the first components 14a will have a thickness of between about 20 μm to about 200 μm for thin ground wafers, and about 100 μm to about 700 μm for thick ground wafers comprising second components 14b. In further instances, the wafer 10 may not be subjected to backgrinding and may comprise a full thickness, t, of from about 760 to 800 μm, or about 780 μm for a wafer 10 having a diameter of 300 mm.

Figure 3A:
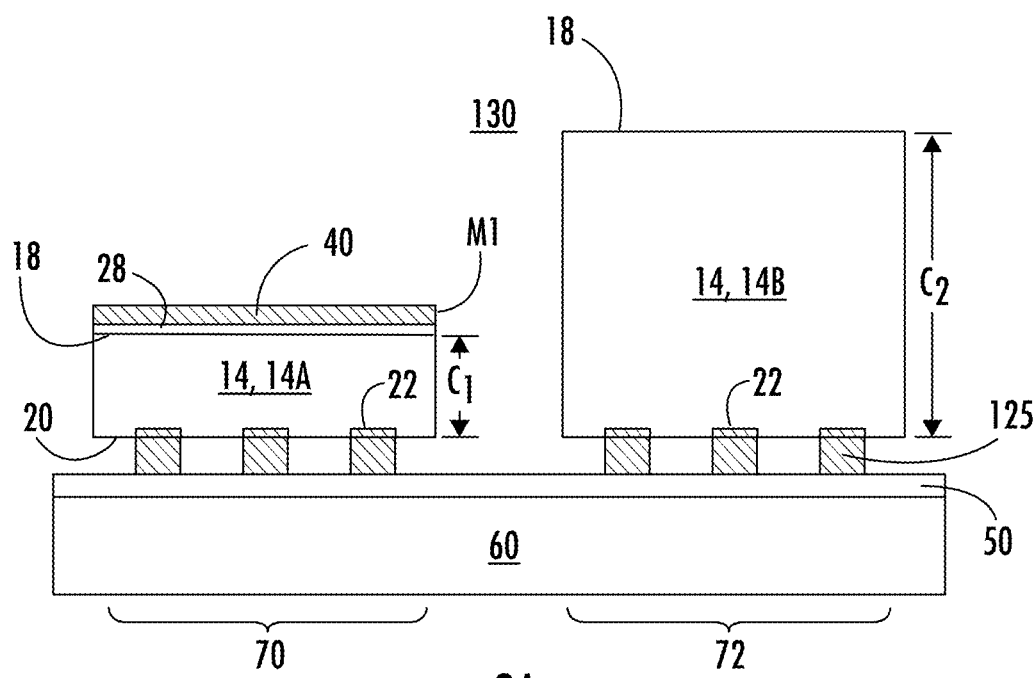
FIGS. 3A-3F show the formation of assemblies comprising a thick component and a thin component of FIGS. 1A-1C.
Figure 3B:
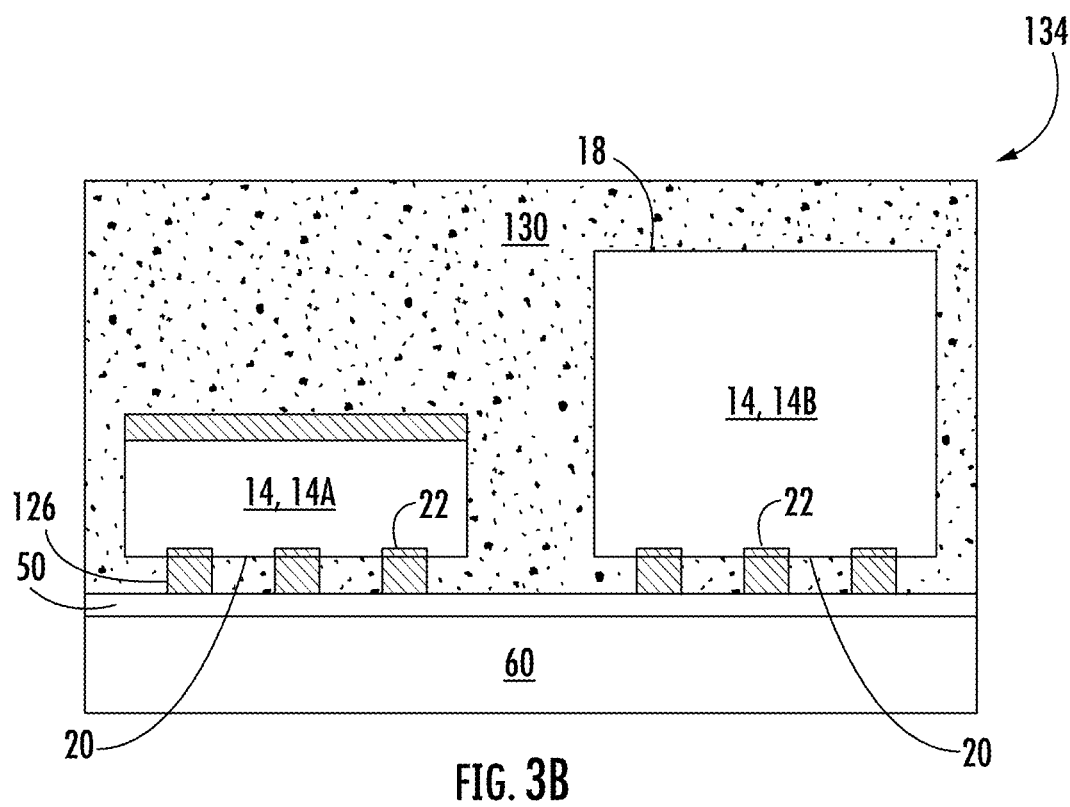
Figure 3C:
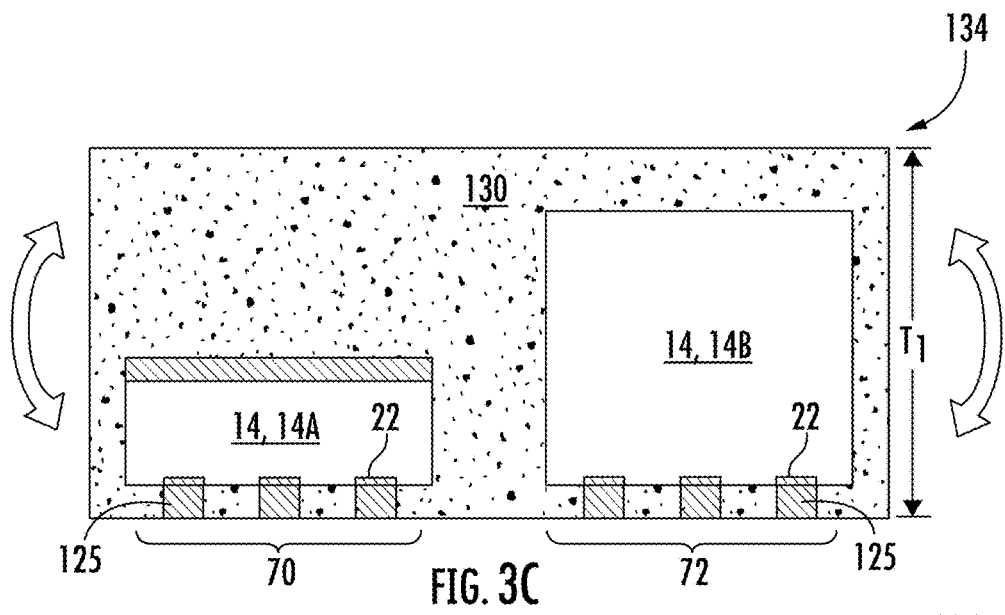
Figure 3D:
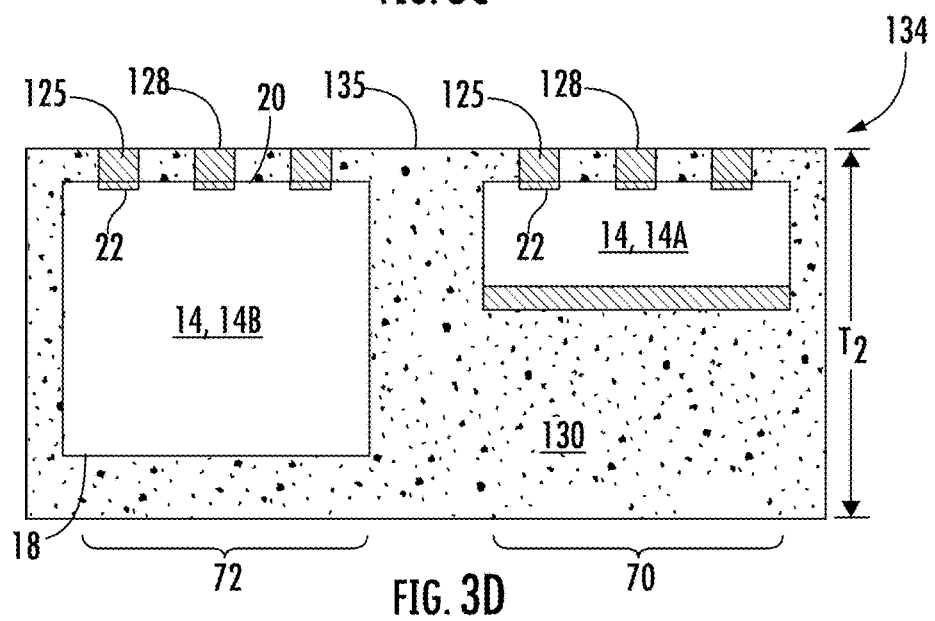
Figure 3E:
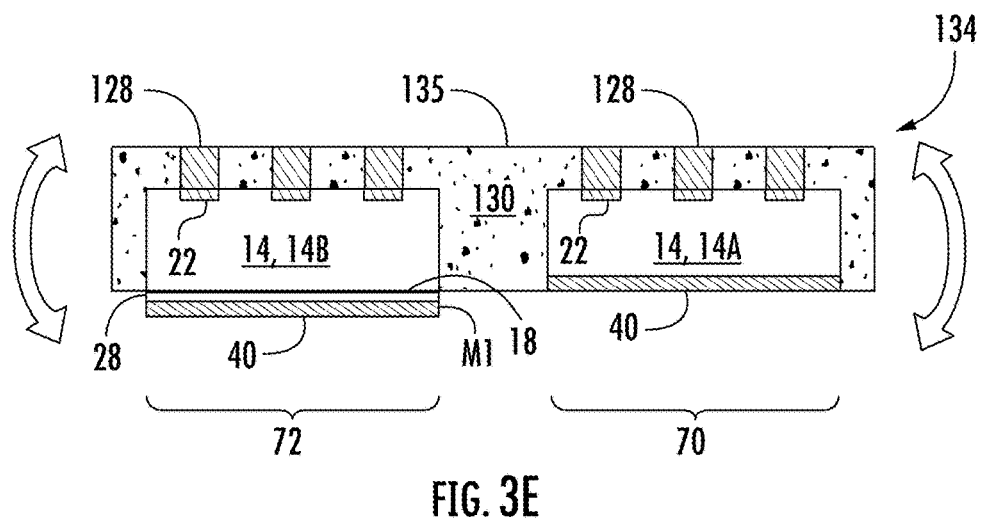
Figure 3F:
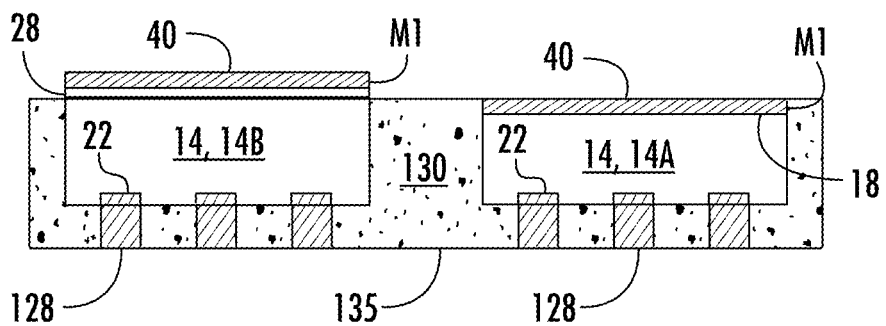
Figure 3G:
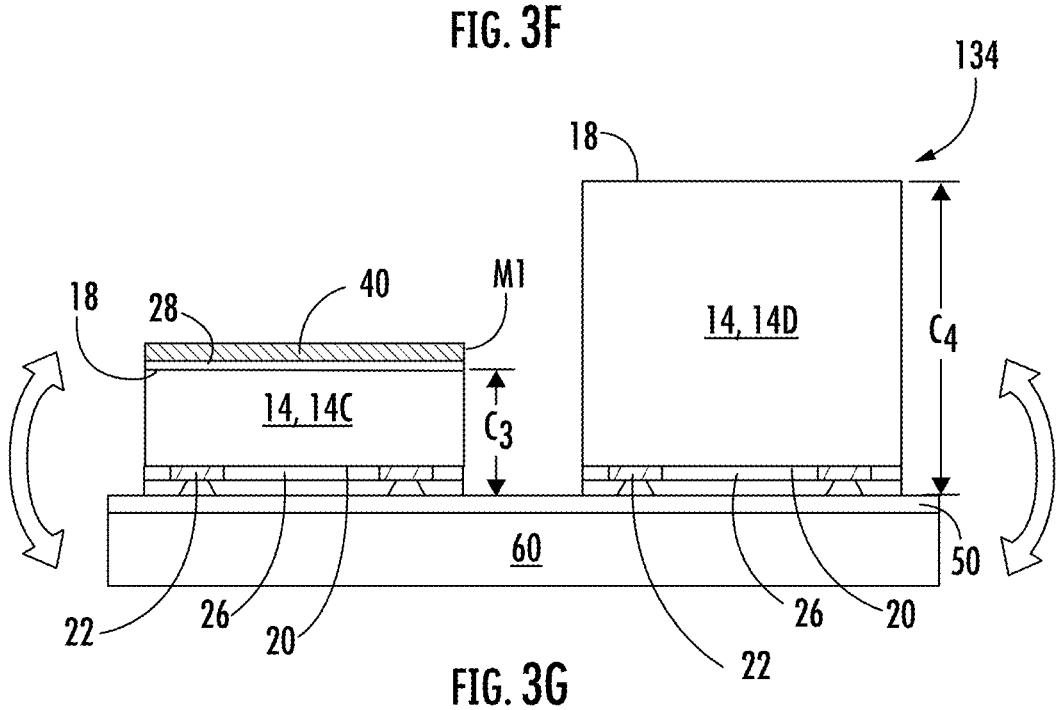
FIGS. 3G-3H show the formation of assemblies without conductive studs and with backside conductive material disposed thereon.
Figure 3H:
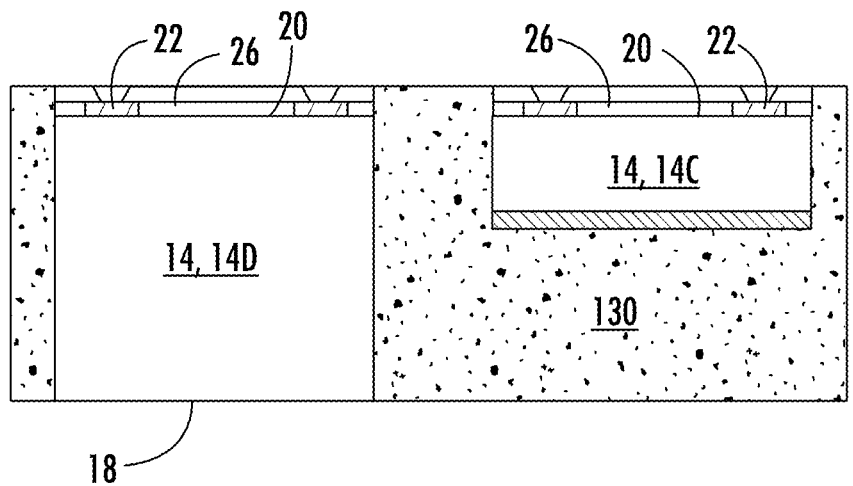
Figure 6A:
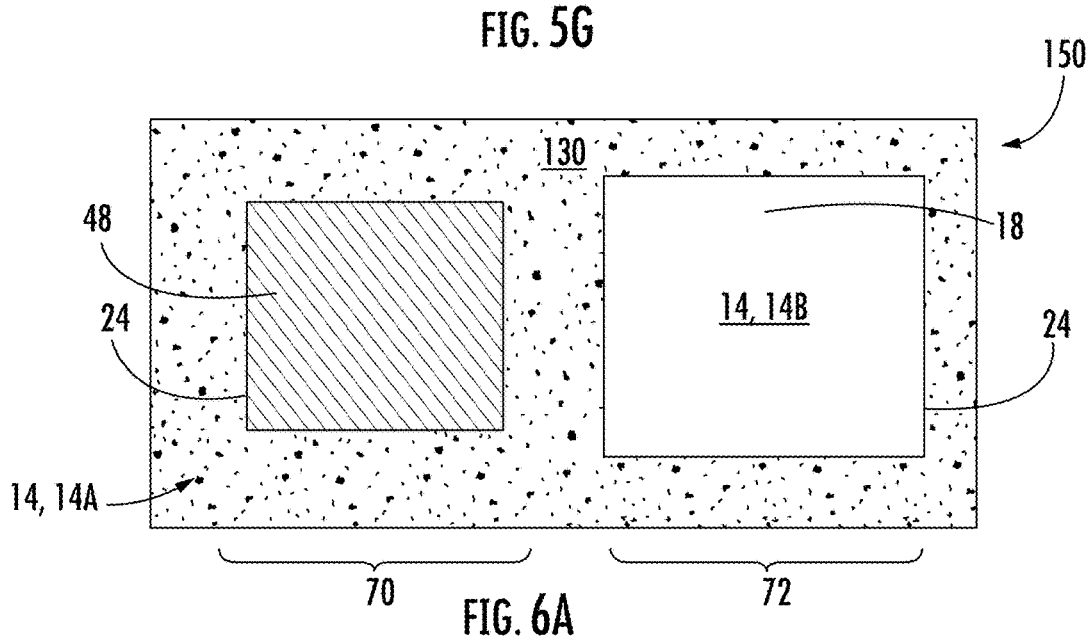
FIGS. 6A-6E illustrate different embodiments of backside conductive material disposed on a backside of the components of FIGS. 1A-1C.
Figure 6B:
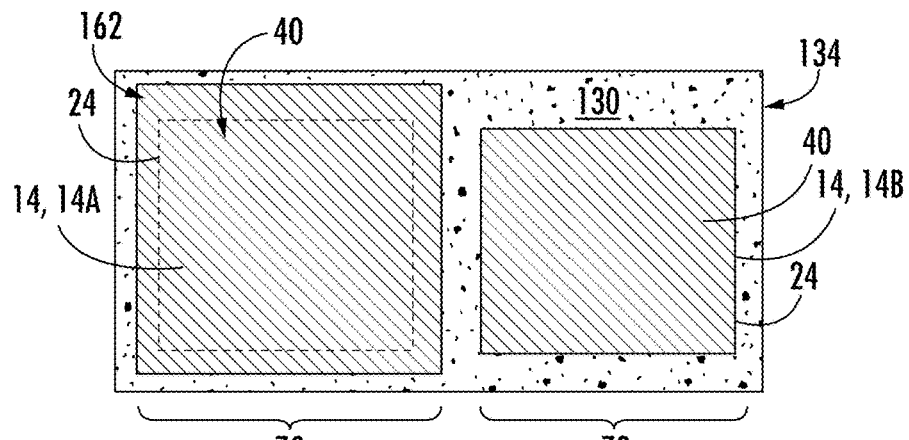
Figure 6C:
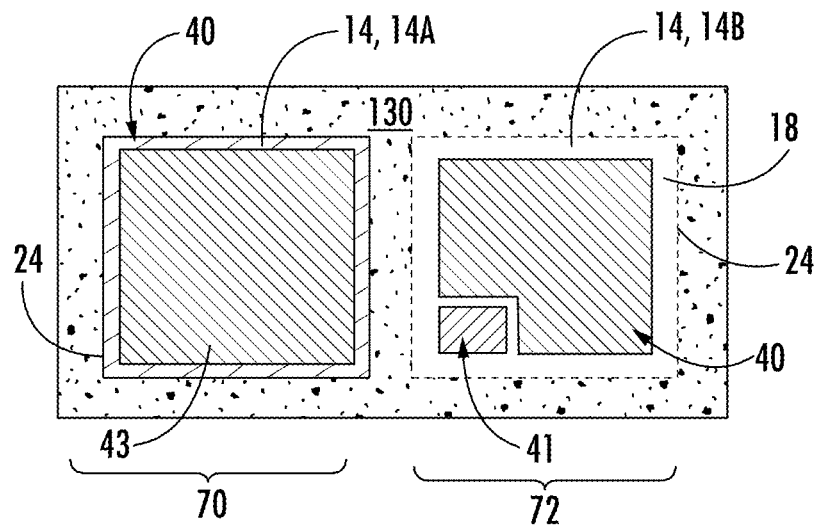
Figure 6D:
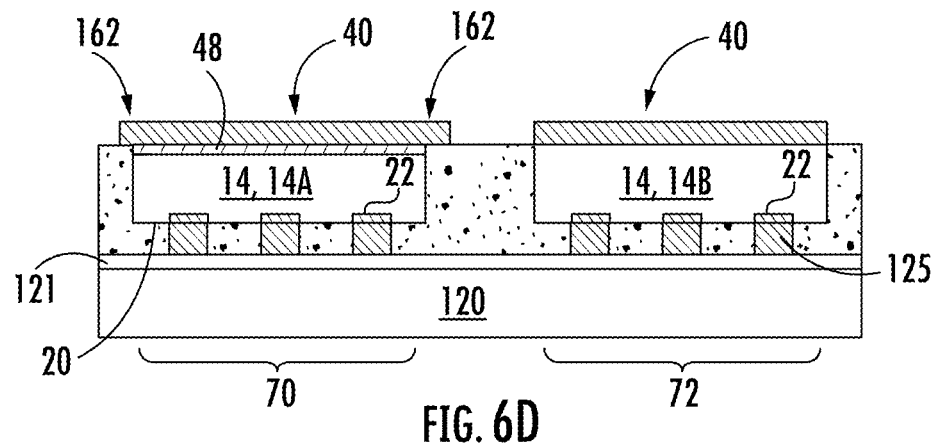
Figure 6E:
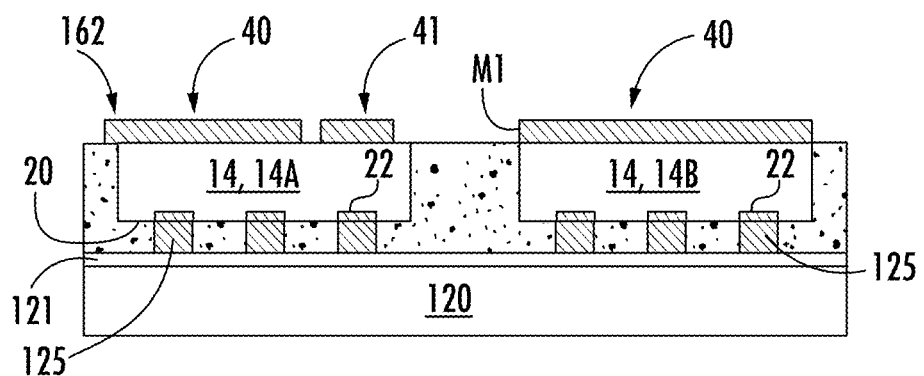

While FIGS. 1B and 1C depict conductive studs 125, in other embodiments, components 14 may not comprise conductive studs 125, as shown in the disclosure following relating to FIGS. 3G, 3H and 6E. In such embodiments, components 14 may be disposed over a first temporary carrier 60 and formed according to the methods and embodiments following.

Figure 2:
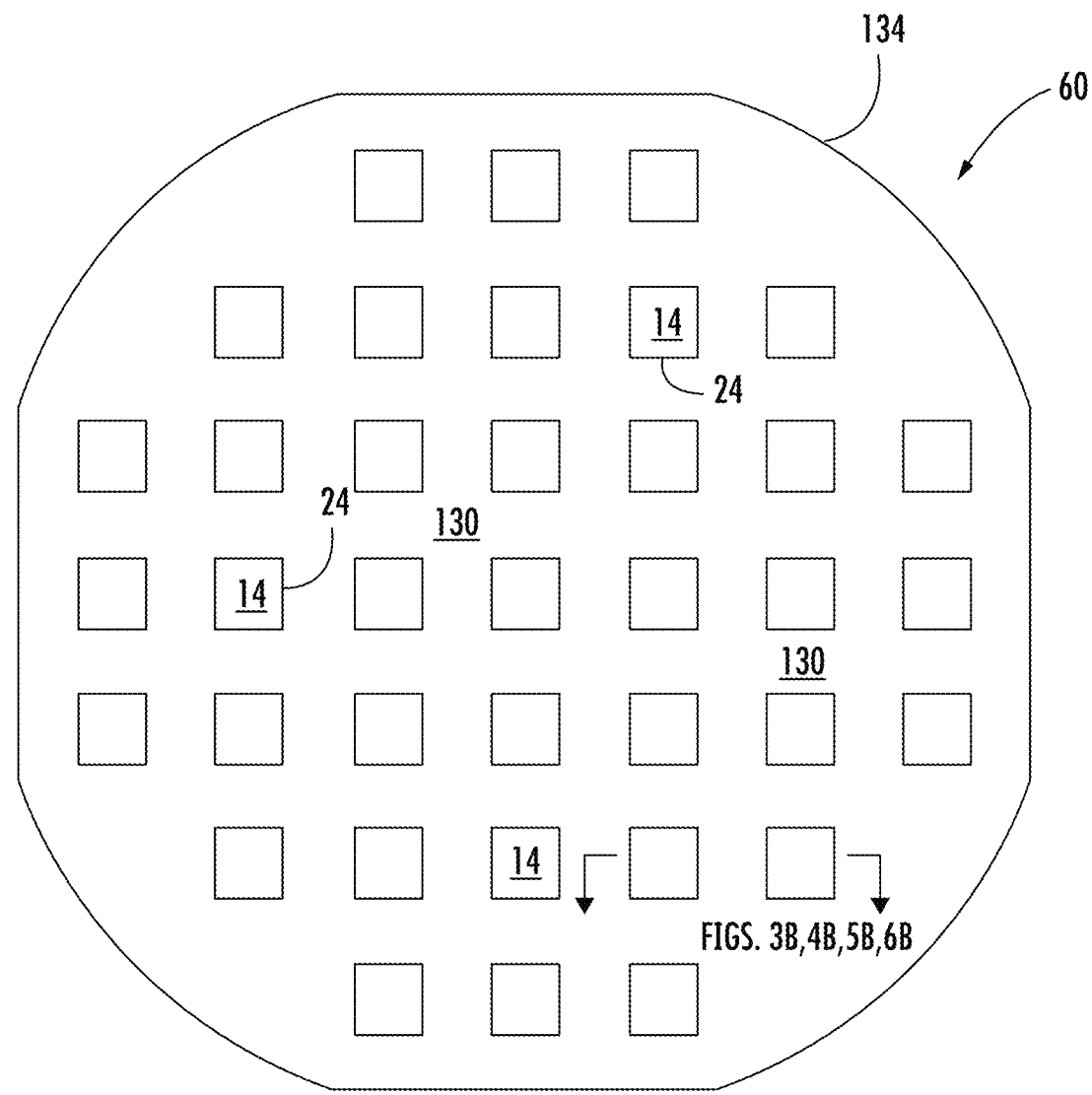
FIG. 2 shows a plan view illustration of an embodiment of a reconstituted wafer or panel comprising a plurality of the components of FIG. 1A disposed in an encapsulant.

FIG. 2 illustrates a plan or top view of a first temporary carrier 60, which may comprise a form factor or footprint of a wafer (circular footprint), a panel (square or rectangle), or of any suitable shape (such as generally circular with flat edges), and may comprise a diameter or width of 200-600 mm, such as 300 mm, or of any other suitable size. The first temporary carrier 60 may comprise a metal or other suitable material. Components 14 may be disposed over first temporary carrier 60 using a pick and place operation, or in any other suitable way. An encapsulant 130 can be deposited around the components 14, including over at least 4, 5, or 6 sides of components 14, such as around 4 sides surfaces, over a front surface 20, and over a backside 18 or back surface. The encapsulant 130 can be deposited around the plurality of components 14 using a paste printing, compression molding, transfer molding, liquid encapsulant molding, lamination, vacuum lamination, spin coating, or other suitable application method. The encapsulant 130 can be a polymer composite material, such as epoxy resin with filler commonly referred to as molding compound or epoxy mold compound (EMC), epoxy acrylate with filler, ABF (Ajinomoto Build-up Film®), or other polymer with proper filler. Components 14 can be embedded together in encapsulant 130, which can be non-conductive and provide mechanical rigidity as well as environmentally protect the components 14 from external elements and contaminants.

In some embodiments, the encapsulant 130 is over or around at least five sides of the component 14. In other embodiments, the encapsulant is over or around at least six sides of the component 14. In some embodiments, the encapsulant is around at least a portion of the sidewalls of the conductive studs 125.

In general, the orientation of components 14, can be either face up, with front surface 20 oriented away from temporary carrier 60 to which the components 14 are mounted, or alternatively can be mounted face down with front surface 20 oriented toward the temporary carrier 60 to which the components 14 are mounted.

More specifically, "face down" as used herein with reference to discrete transistors means a surface of component 14 having one or more gate or base electrodes and one or more source or emitter electrodes disposed thereon is oriented toward temporary carrier 60. "Face down" as used herein with reference to power diodes means having a cathode oriented toward temporary carrier 60.

"Face up" as used herein with reference to discrete transistors means a surface of component 14 having the gate or base electrode and source or emitter electrode disposed thereon is oriented away from temporary carrier 60. Similarly, "face up" as used herein with reference to power diodes means having an anode oriented toward temporary carrier 60.

A person of skill in the art would understand that the surface of component 14 may comprise either front surface 21, or backside 18, dependent upon the component or device type and the disposition of the gate or base electrode, the source or emitter electrode, and the anode.

An adhesive 30 can be included, or omitted from, back surface 18 of components 14, depending on the process used for encapsulating the components 14 and forming a panel or reconstituted panel 134 comprising components 14 fully molded within encapsulant 130.

The panel 134 can optionally undergo a curing process to cure encapsulant 130. A surface of encapsulant 130 can be substantially coplanar with adhesive 30. Alternatively, encapsulant 130 can be substantially coplanar with backside 18, the encapsulant being exposed by the removal of first temporary carrier 60 and interface layer or thermal release tape 50. The reconstituted panel 134 can include a footprint or form factor of any shape and size including circular, rectangular, or square, such as a form factor in a range of 200-600 millimeters (mm), including that of a semiconductor wafer including a circular footprint having a diameter of 300 mm. Any other desirable size can also be formed.

FIG. 3A illustrates a cross-sectional side view in which the components 14 (similar to FIGS. 1B and 1C) are disposed face down over a temporary carrier 60, the component 14 comprising conductive studs 125 over a surface (such as the front surface 20) of the component 14. The components 14 may be placed adjacent one another, such as in a side-by-side arrangement, and subsequently coupled together. Multiple components 14 may also be processed together at a same time over the first temporary carrier 60, such as shown and described with respect to FIG. 2. It will be understood by a person of ordinary skill in the art (POSA), that the close-up views of just portions of the component 14 are shown as representing a small portion of what may be occurring at reconstituted wafer or panel level 134.

In the illustration of FIG. 3A, components 14 are mounted face down with the copper studs (conductive studs 125) contacting the thermal release tape 50. In some embodiments, one may want to mount the components 14 face up with the copper studs (conductive studs 125) on the opposite face of the component 14 than where the thermal release tape 50 contacts the component 14. In FIG. 3A, one component 14a has conductive backside material 40 disposed over a backside 18 and insulating layer 28, and the device is supported by a first temporary carrier 60 which in some embodiments comprises a metal carrier. In certain embodiments, more than two components 14 may be mounted. In certain embodiments, more than one component 14 may comprise conductive backside material 40.

In some instances, the conductive backside material 40 is a good thermal conductor and comprises one or more layers of metal, including: copper, aluminum, silver, gold, brass, tungsten, molybdenum, nickel, titanium, vanadium, other suitable metal, graphite, graphene, carbon nanotubes (CNTs), diamond-like carbon (DLC), or other suitable carbon materials, glass, ceramics, including: aluminum nitride (AlN) and boron nitride (BN), and polymers including polyimides and liquid crystalline polymers (LCPs).

In other instances, the conductive backside material 40 is a good electrical conductor and comprises one or more layers of metal, including: copper, aluminum, silver, gold, brass, tungsten, molybdenum, nickel, titanium, vanadium, other suitable metal, graphite, graphene, carbon nanotubes (CNTs), or other suitable carbon materials, indium tin oxide (ITO), and conductive polymers.

In other instances, the conductive backside material 40 is both a good thermal conductor and a good electrical conductor and comprises one or more layers of metal, including: copper, aluminum, silver, gold, brass, tungsten, molybdenum, nickel, titanium, vanadium, other suitable metal, graphite, graphene, carbon nanotubes (CNTs), or other suitable carbon materials, and conductive polymers.

In yet other instances, the conductive backside material 40 is a good thermal conductor and a poor electrical conductor and comprises one or more layers of diamond-like carbon (DLC), glass, and ceramics.

Additionally, while the components 14a and 14b in FIG. 3A may be about 200 µm and 650 µm in height, respectively, any thickness component can be processed in this manner together with standard thickness devices. As such, the first component 14a may comprise a first thickness, $C_1$, in a range of about 10-300 μm, 100-300 μm, and in other instances may be less than 300 μm. The second component 14b may comprise a second thickness, $C_2$, greater than the first thickness $C_1$, the second thickness $C_2$, being in a range of about 51-800 μm, or 400-800 μm. In some embodiments, the conductive backside material 40 has a thickness, M1, in a range of 1-1500 micrometers (μm) over at least a portion of one or more of the component backside 18. The conductive backside material 40 can serve the function of heat dissipation, heat conduction, shielding, power, ground, electrical performance, electrical contact, electrical conduction, or structural reinforcement.

In certain embodiments, the conductive backside material 40 comprises copper or other metals. Some conductive backside material 40 comprises diamond-like carbon (DLC), graphite, carbon nanotubes or other carbon material.

In some embodiments, the conductive backside material 40 comprises a single portion that extends over: at least a portion of the backside 18 of at least one component 14 and at least a portion of the single layer of encapsulant 130 disposed around at least one of the components 14.

Some assemblies have conductive backside material 40 extending to an edge 131 of the electronic assembly 150. In other assemblies, the conductive backside material 40 comprises a setback 160 from the edge 131 of the electronic assembly 150.

In some embodiments, the conductive backside material 40 is applied: after the encapsulant 130 is disposed over or around at least four surfaces of the component 14 and removed; and after removing a portion of the encapsulant 130 to expose a backside 18 of the component 14 (for example as depicted in FIGS. 3E, 3H, 4D-4I, 5G).

Certain embodiments, such as shown by component 14a in FIG. 3A, further comprise disposing the conductive backside material 40 over backside 18 before the encapsulant 130 is disposed over or around the component 14. In such instances, the component 14 (such as a BGA product) may be shipped to a packaging facility comprising a pre-applied conductive backside material 48 already applied before shipping. In other instances, the component 14 may be shipped without any conductive backside material 40, the conductive backside material 40 being added during packaging.

In some embodiments, the conductive backside material 40 comprises: a first portion of the conductive backside material 40 formed within at least one of footprints 70, 72 of the components 14a and 14b, respectively. In certain embodiments, the conductive backside material 40 extends beyond one or more of footprints 70, 72 of the components 14a and 14b respectively, such as by forming the conductive backside material 40 after the placement of the encapsulant 130, as shown in FIG. 4D. In yet other embodiments, the conductive backside material 40 may comprise more than one layer of material, such as two or more layers of material, the first of which may be a pre-applied backside material 48 (as shown in FIG. 6A), applied before shipping to a packaging location, and subsequent layers (as shown in FIGS. 6C and 6D), being formed over the first pre-applied backside material 48, whether over just the component 14 (so as to be within the footprints 70, 72 of the components 14a and 14b respectively) or extending outside at least one of the footprints 70, 72.

In some embodiments, the conductive backside material 40 is electrically isolated from one or both of the components 14. In other embodiments, the conductive backside material 40 is configured to be electrically connected to the component 14. The conductive backside material 40 may further comprise one or more of a heatsink, cold plate, or liquid cooling, or a heatsink or cold plate, or liquid cooling coupled or directly attached thereto.

Some assemblies further comprise forming an insulating layer 28 disposed between the backside 18 of the component 14 and conductive backside material 40 as shown in FIG. 3A, wherein the insulating layer 28 comprises a layer of polyimide, polymer, or inorganic dielectric. In these assemblies, insulating layer 28 provides electrical isolation of conductive backside material 40 from one or both of the first component and the second component. In other assemblies which do not comprise insulating layer 28, conductive backside material 40 is configured to be electrically connected to one or both of the first component and the second component. Insulating layer 28 is not depicted in all figures for simplicity. However, a POSA would understand that while not shown, it may nonetheless be present in various embodiments.

Thus, FIG. 3A illustrates providing a first temporary carrier 60; providing a first component 14a with conductive studs 125 coupled to a front surface 20 of the first component 14a and coupling the first component 14 face down over the first temporary carrier 60, the first component 14 comprising a first thickness, $C_1$, in a range of 10-300 μm; and providing a second component 14b with conductive studs 125 coupled to a front surface 20 of the second component 14b and coupling the second component 14b face down over the temporary carrier, the second component 14b comprising a second thickness, $C_2$, greater than the first thickness, the second thickness being in a range of 10-800 μm.

FIG. 3B, continuing from FIG. 3A, illustrates a cross-sectional view of components 14 where an encapsulant 130 has been disposed as a single layer of material over or around at least five surfaces of the first component 14a, over or around at least five surfaces of the second component 14b, and around at least a portion of the sidewalls 126 of the conductive studs 125.

FIG. 3C, continuing from FIG. 3B, illustrates a cross-sectional view of the encapsulated components 14a, 14b having a thickness, T1, where the thermal release tape 50 and first temporary carrier 60 have been debonded from the encapsulated components. Further illustrated is first footprint 70 corresponding to first component 14a, and second footprint 72 corresponding to second component 14b.

FIG. 3D, continuing from FIG. 3C, illustrates a cross-sectional view where a topgrind, or front surface grind, of encapsulated components has occurred to a thickness, T2. In some embodiments, the thermal release tape 50 and first temporary carrier 60 may be removed by grinding as part of the topgrind process, rather than the debonding process as discussed for FIG. 3C. After the topgrind, the conductive studs 125 may be exposed at an outer surface 128. The topgrind to remove a portion of the encapsulant may form a frontside planar surface 135 which is substantially planar across the encapsulant 130 covering the plurality of components. The frontside planar surface 135 may comprise ends or exposed ends 128 of the conductive studs 125 and a planar surface of the encapsulant layer 130. The planar surface of the frontside planar surface 135 may comprise a roughness less than 500 nanometers (nm) over a characteristic measurement distance. The characteristic measurement distance is defined by the ISO 4288 standard, the entirety of which is hereby incorporated by reference. The characteristic measurement distance may also be a distance great enough to characterize the roughness, such as to a generally accepted level of certainty, and in some instances could be a distance of three times the distance of the roughness. While conventional encapsulant grinding might be done with less flatness, greater accuracy and precision can be obtained by using integrated sensors such as laser, acoustic, or other non-contact methods to control the grinding resulting in better flatness.

According to a particular embodiment, one component, 14b, may have a thickness $C_2$ of about 650 μm thick and the other component, 14a, may have a thickness $C_1$ of about 200 μm thick.

FIG. 3E, continuing from FIG. 3D, shows where a portion of the encapsulant 130 has been removed by performing a backgrind process to expose the backside conductive material 40 disposed on the backside 18 of the first component 14a, thereby reducing the thickness T2 to a thickness $T_3$ and exposing backside 18, of the second component 14b. Similar to FIG. 3A, insulating layer 28 may be optionally disposed over the backside 18 of the component 14b and conductive backside material 40 may subsequently be applied atop optional insulating layer 28 or over backside 18.

FIG. 3F, continuing from FIG. 3E, depicts where the reconstituted panel 134 has been flipped to a face down configuration. FIGS. 3G and 3H illustrate package configurations without conductive studs 125.

FIG. 3G shows a cross-sectional side view in which components 14 (similar to FIGS. 1B and 1C) are disposed face down over thermal release tape 50 and first temporary carrier 60 where the components\14, 14c having thickness $C_3$, and component 14, 14d having thickness $C_4$, do not comprise conductive studs 125. Rather, components 14, 14c and 14, 14d include contact pads 22 for electrical connection. As in FIG. 3A, the components 14 may be placed adjacent one another, such as in a side-by-side arrangement, and subsequently coupled together. Multiple components 14 may also be processed together at a same time over the first temporary carrier 60, such as shown and described with respect to FIG. 2.

FIG. 3H, continuing from FIG. 3G, depicts a cross-sectional view where encapsulant 130 has been disposed as a single layer of material over or around at least five surfaces of the components 14, 14c and 14, 14d of FIG. 3G and the thermal release tape 50 and first temporary carrier 60 have been debonded. FIG. 3H further illustrates where a backgrind (not shown) of the encapsulated components has been performed to reduce overall package height and expose backside 18 of component 14, 14d. Residual encapsulant 130 formed over contact pads 22 may be removed by laser ablation or plasma etching, thus allowing for subsequent electrical coupling to contact pads 22 of either or both of components 14, 14c and 14, 14d using wirebonds or similar electrical interconnects. Electrical connection may also be made to a backside conductive material 40 (not shown) which in some embodiments may be formed over backside 18 of component 14, 14d.

FIGS. 4A-4I illustrate the formation of assemblies including same or similar thicknesses or, such as two standard thickness components, comprising a conductive backside material 40 having a thickness, M1, in a range of 1-1500 μm over at least a portion of one or more of a backside 18 of the first component 14a or over at least a portion of a backside 18 of the second component 14b. The conductive backside material 40 provides one or more benefits to the first component 14a or the second component 14b, including: heat dissipation, heat conduction, shielding, power, ground, electrical performance, electrical contact or electrical conductivity, or structural reinforcement. In some embodiments the components 14, such as the first component 14a and the second component 14b, are each oriented in the same direction or with the same orientation (face up or face down). Whether the components 14 are mounted face up or face down, the components 14 may comprise thicknesses that are the same, or substantially the same, or different, or substantially different.

Figure 4A:
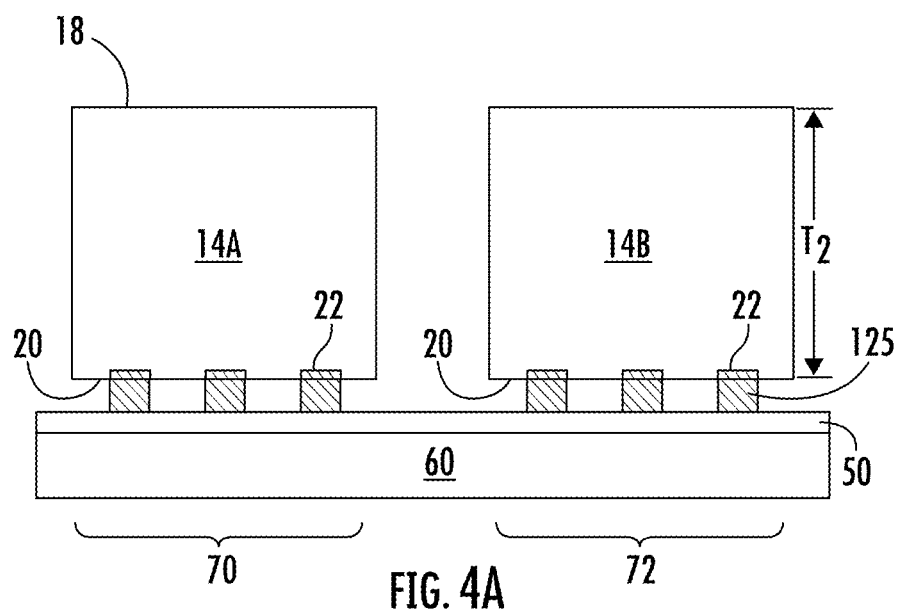
FIGS. 4A-4I show the formation of assemblies comprising two thick components.

FIG. 4A illustrates a cross-sectional side view of an assembly (similar to that of FIG. 3A), in which the components 14a and 14b (from FIG. 1C) having a first footprint 70 and a second footprint 72, respectively, are disposed face down over a first temporary carrier 60. The conductive studs 125 can be mounted over a surface such as the active surface 20 of the components 14 as discussed with respect to FIGS. 1B and 1C. The components 14 may be placed adjacent one another, such as in a side-by-side arrangement, and subsequently coupled together. This figure starts with both components 14a and 14b with the same height or thickness, or substantially the same thickness, $C_2$.

Figure 4B:
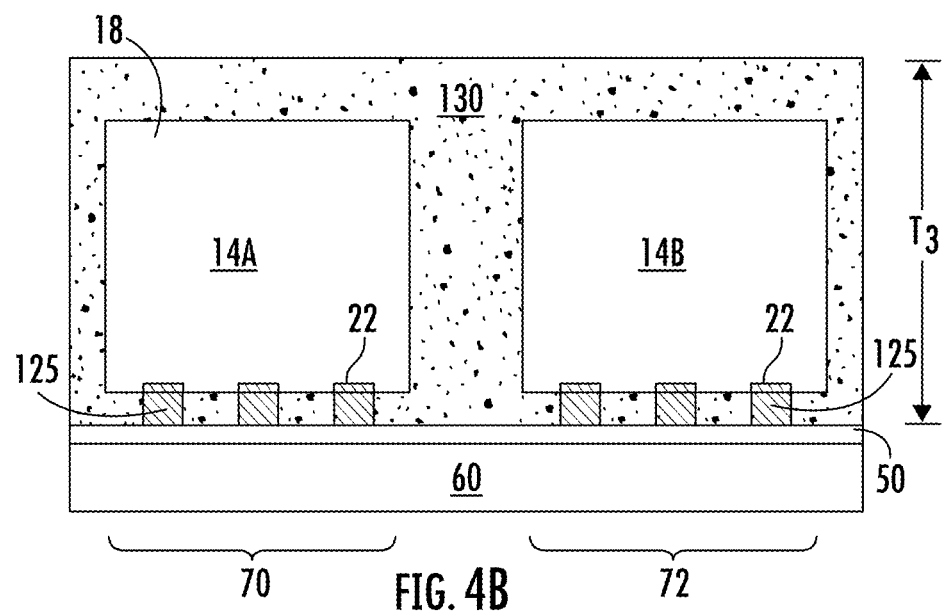

FIG. 4B, continuing from FIG. 4A, illustrates a cross-sectional view of the assembly where components 14a and 14b have an encapsulant 130 disposed as a single layer of material, to a thickness or height of $T_3$, over or around at least five surfaces of the components 14 and around at least a portion of the sidewalls 126 of the conductive studs 125.

Figure 4C:
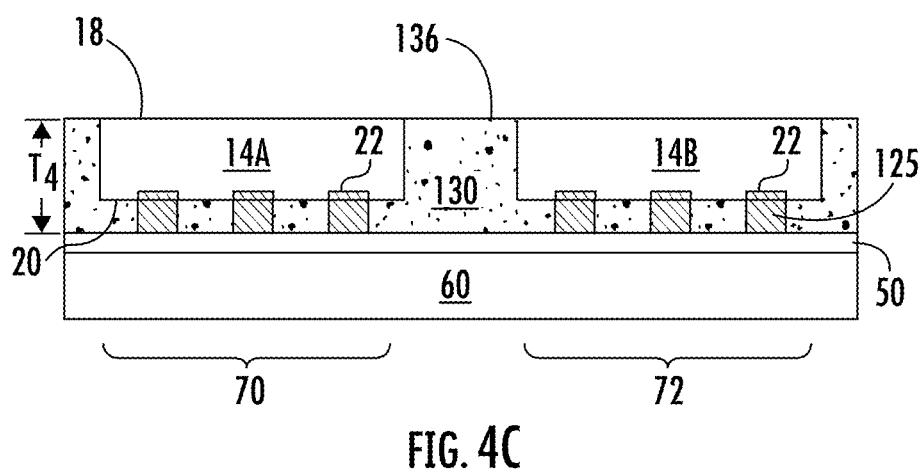
Figure 4D:
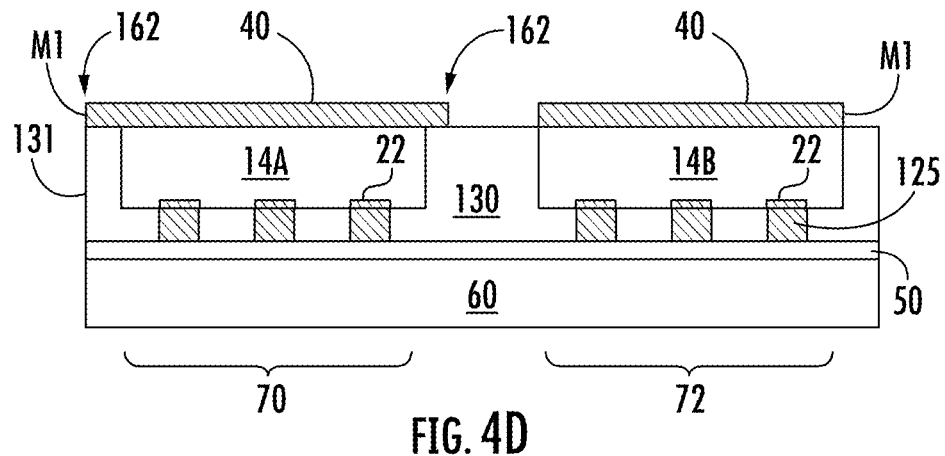

FIG. 4C, continuing from FIG. 4B, illustrates a cross-sectional view of the assembly where a backgrind of encapsulated components 14a and 14b has occurred to a thickness or height of $T_4$. In this embodiment, encapsulant 130 extending above the backside 18 of the components has been removed and the thickness $C_2$ of the components 14a and 14b has been reduced. Or in other words, FIG. 4C illustrates removing a portion of the encapsulant 130, and a portion of the thickness $C_2$ of components 14a and 14b, to expose a backside 18 of the components 14a and 14b, or in other embodiments, to expose a pre-applied backside material 48 as depicted in FIG. 6A. Any number of components 14 may be embedded within the encapsulant 130 and background to reduce a thickness of the components or to expose the backside materials as disclosed herein. The backgrind process forms a backside planar surface 136 (as depicted in FIG. 4C) comprising a planar surface of the encapsulant 130 and the backside 18 of the components 14a or 14b (or pre-applied backside metal 48 as shown in FIG. 6C). The backside planar surface 136 of the encapsulant 130 comprises a roughness less than 500 nanometers (nm) over a characteristic measurement distance as described herein with reference to the ISO 4288 standard.

FIG. 4D, continuing from FIG. 4C, illustrates a cross-sectional view of the assembly where conductive backside material 40 is disposed over a backside 18 of both of the components 14a and 14b. In this illustration, as shown for component 14a, the conductive backside material 40 comprises an extended portion or overhang 162 extending beyond the footprint 70 of component 14a, to an edge 131 of the assembly 150. While shown for component 14a, a POSA would understand that the conductive backside material 40 may be disposed over any of the components 14 and comprise overhang 162 according to a required functionality of the component 14. As shown for component 14b, the conductive backside material 40 is disposed over backside 18 of component 14b, and thus within footprint 72 of component 14b.

Figure 4E:
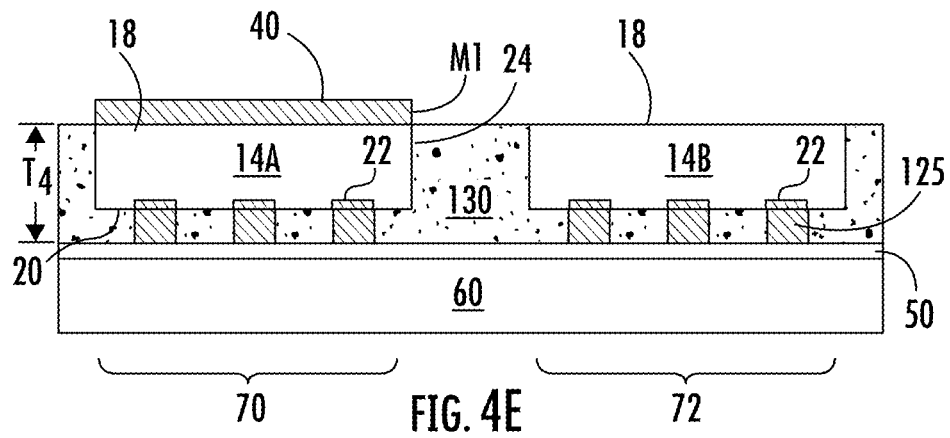

FIGS. 4E-4I depict various embodiments of conductive backside material 40 disposed over components 14. FIG. 4E, continuing from FIG. 4D, illustrates a cross-sectional view where conductive backside material 40 is disposed over backside 18 of component 14*a*. In this illustration, the conductive backside material 40 covers the backside 18 of the component 14*a* so that the conductive backside material 40 extends to, and flush with, the edge 24 of the component 14*a* without an extended portion 162 or setback 160. Thus, the conductive backside material 40 is disposed within footprint 70 of component 14*a*.

Figure 4F:
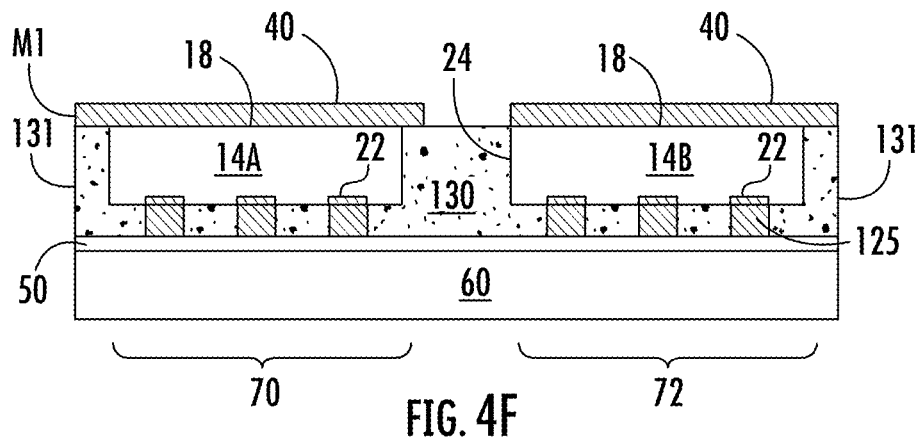

FIG. 4F, continuing from FIG. 4E, illustrates a cross-sectional view where conductive backside material 40 is disposed over backside 18 of both of the components shown in the figure. In this illustration, component 14*a* shows conductive backside material 40 as flush with an edge 131 of assembly 150, and also having an extended portion 162 over an opposing edge 24 of the component 14*a*, similar to FIG. 4D. As shown for component 14*b*, the conductive backside material 40 may be disposed over backside 18 of component 14*b* and flush with both an edge 131 of assembly 150 and an edge 24 of component 14.

Figure 4G:
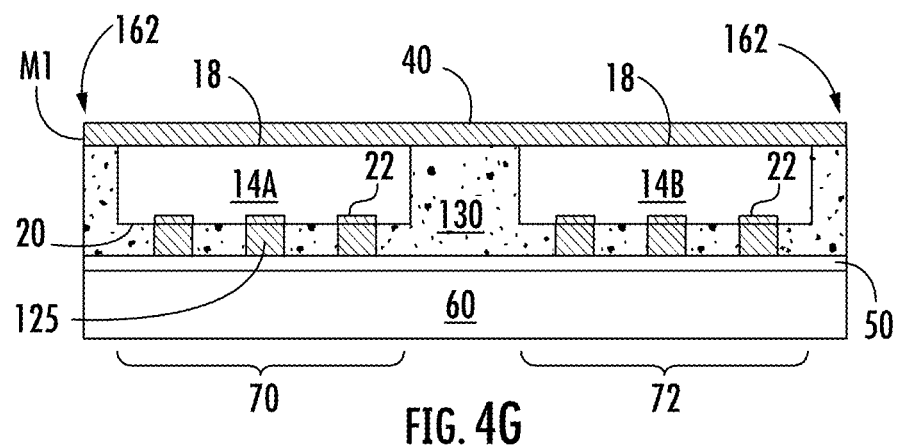

FIG. 4G, continuing from FIG. 4F, illustrates a cross-sectional view of the assembly where conductive backside material 40 is disposed over both of the components 14*a* and 14*b* shown in the figure. In this illustration, the conductive backside material 40 extends over the entire surface of the electronic assembly 150 and further comprises extended portions 162 flush with edges 131 of the electronic assembly 150.

Figure 4H:
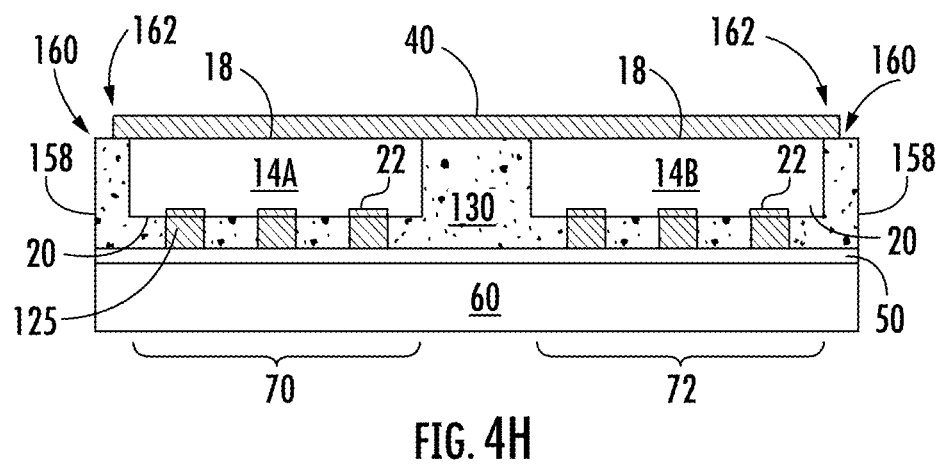

FIG. 4H, continuing from FIG. 4G, illustrates a cross-sectional view where conductive backside material 40 is disposed over both of the components 14*a* and 14*b* similar to what is included in FIG. 4G. In this illustration, the conductive backside material 40 extends over the entire surface of both of the components 14*a* and 14*b* with setbacks 160 (or pull backs) from the assembly ends 158.

Figure 4I:
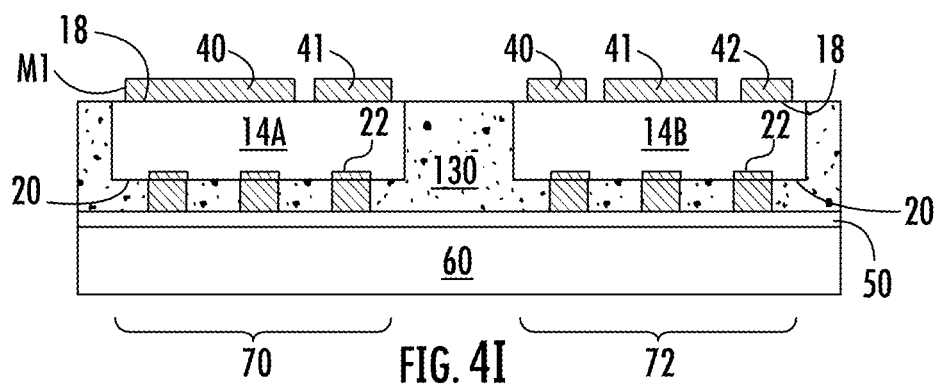

FIG. 4I, continuing from FIG. 4H, illustrates a cross-sectional view where conductive backside material 40 may be formed on backside 18 of one or both of components 14*a* and 14*b* and patterned in two or more portions, such as second conductive backside material 41 and third conductive backside material 42 as also depicted in FIG. 6C following. The conductive backside material 40 as shown and described for FIGS. 4D to 4I may be applied after the encapsulant is disposed over or around at least four surfaces of the first component, and over or around at least four surfaces of the second component, and after removing a portion of the encapsulant to expose a backside 18 of the first component 14*a* or the second component 14*b*.

In some embodiments, conductive backside material 40, second conductive backside material 41 and third conductive backside material 42 may have good electrical conductivity and may comprise electrodes of various types dependent upon the component functionality. A person of ordinary skill would understand that the two or more conductive backside materials 41 and 42 may comprise setbacks 160 or extended portions 162 as depicted and described for any of FIGS. 4D-4I.

Figure 5A:
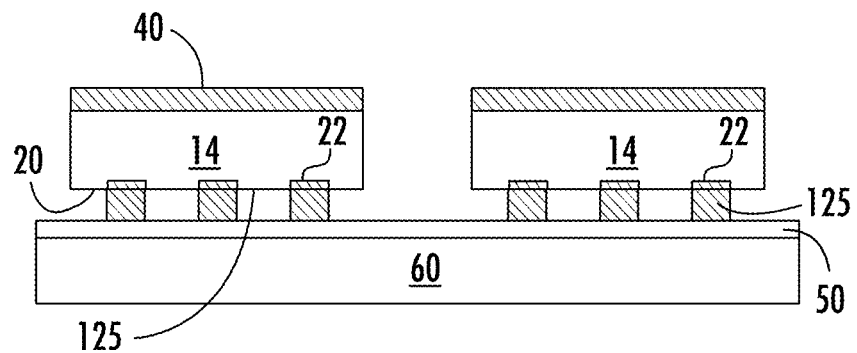
FIGS. 5A-5D illustrate the formation of a subassembly comprising the components of FIGS. 1A-1C.

FIGS. 5A-5G illustrate embodiments of assemblies formed using more than one encapsulation process. FIG. 5A illustrates a cross-sectional side view (similar to that of FIGS. 3A and 4A), in which the components 14 (from FIG. 1C) are disposed face down over a thermal release tape 50 and a first temporary carrier 60, the components 14 comprising conductive studs 125 over a surface (such as the front surface 20) of the component 14. The components 14 may be placed adjacent one another, such as in a side-by-side arrangement, and subsequently coupled together. In this embodiment, both components 14 have the same height or thickness, $C_0$. Thickness $C_0$ may include any thickness of a component, dependent upon the device or component type, whether thinned by a backgrind process or a standard, full thickness wafer without having been subjected to a thinning process. Also, each component 14 has conductive backside material 40 on a side of component 14 opposite the conductive studs 125.

Figure 5B:
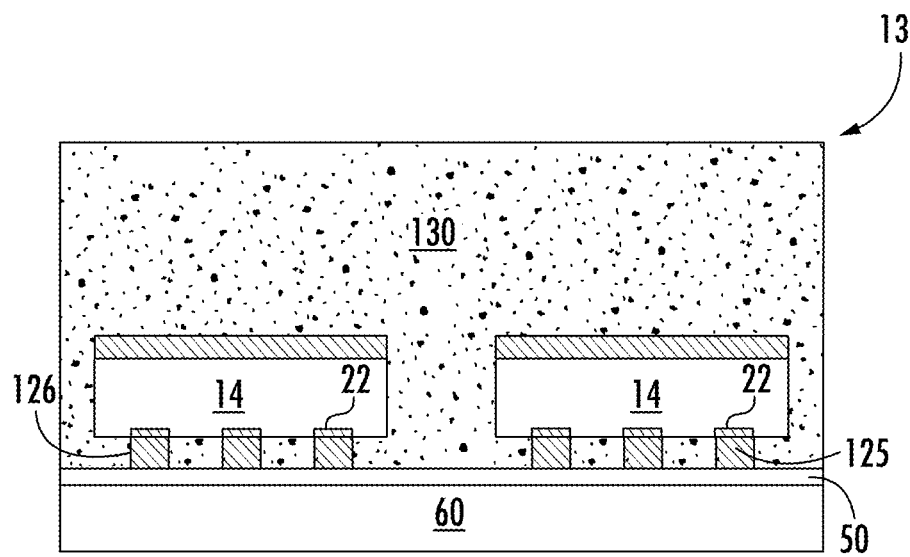

FIG. 5B, continuing from FIG. 5A, illustrates a cross-sectional view of the assembly where components 14 have an encapsulant 130 disposed as a single layer of material over or around at least five surfaces of the components 14 and around at least a portion of the sidewalls 126 of the conductive studs 125. In this embodiment, each component 14 has conductive backside material 40 applied to each component 14 on the opposite side of the component 14 than the conductive studs 125.

Figure 5C:
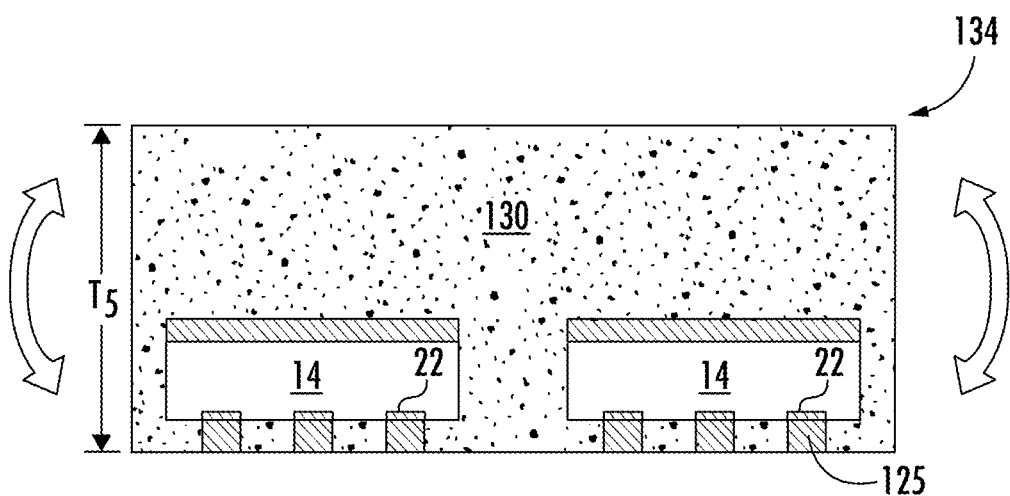

FIG. 5C, continuing from FIG. 5B, illustrates a cross-sectional view of panel or reconstituted wafer 134 showing the encapsulated components where the thermal release tape 50 and first temporary carrier 60 have been debonded from the encapsulated components.

Figure 5D:
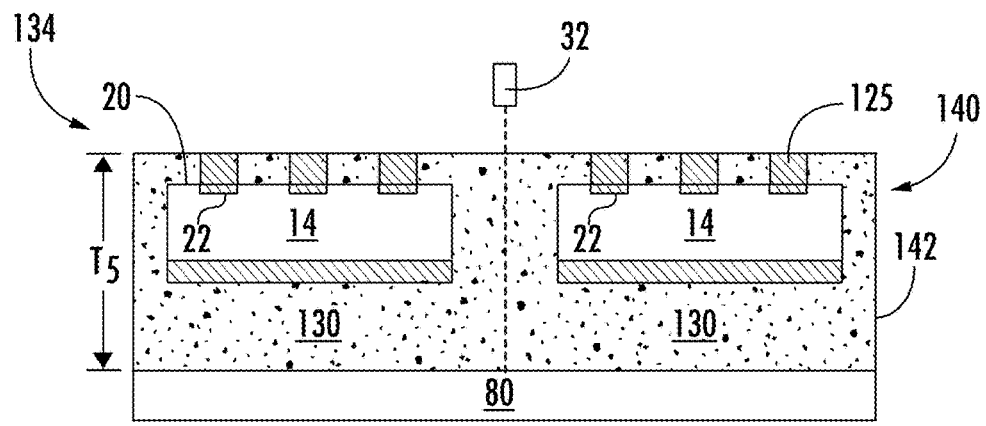

FIG. 5D, continuing from FIG. 5C, illustrates a cross-sectional view where the panel or reconstituted wafer 134 is placed on a dicing tape 80 mounted on a structural or metal frame for singulation from the panel 134 into subassemblies 140 comprising components 14. The singulation site is illustrated by the vertical dashed line of FIG. 5D. Upon singulation, the subassemblies 140 have a thickness, $T_5$, and an outer surface 142 defining an external shape of the subassembly 140. While shown for component 14, as described above, a person of skill in the art would understand that components of varying thicknesses may be included. Subassemblies 140 may comprise components 14 including a transistor, a FET, a JFET, a MOSFET, a BJT, an IGBT, a SIT, a Schottky transistor, a diode, a microcontroller unit (MCU), an analog device, a passive device, an RF device, a multiplier function, a clock, and a chiplet.

Figure 5E:
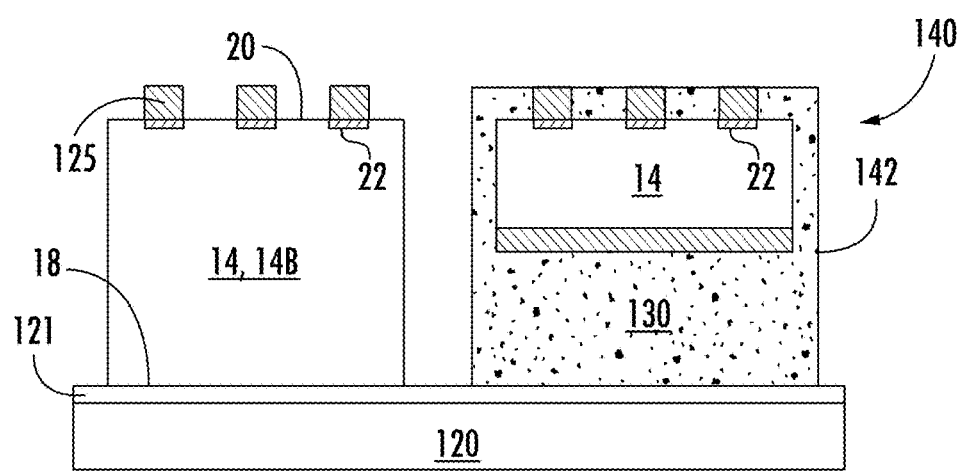
FIGS. 5E-5G illustrate forming a multi-encapsulant assembly comprising the subassembly of FIG. 5D.

FIG. 5E, continuing from FIG. 5D, illustrates disposing subassembly 140, comprising component 14 having a thickness $C_0$, and a second component 14*b* having a thickness $C_2$, in a face up configuration over second thermal release tape 121 and second temporary carrier 120. Thickness $C_0$ of component 14 is less than thickness $C_2$, of second component 14*b*. The thickness, $T_5$, of subassembly 140 is configured to be the same as, or substantially the same as, thickness $C_2$ of second component 14*b* and the thickness or height $H_1$ of the conductive interconnects 125. In the face up configuration as shown, the conductive studs 125 for each of the component 14 and second component 14*b* are positioned at, or substantially at, the same vertical distance, and oriented away from, the second thermal release tape 121 and second temporary carrier 120.

Figure 5F:
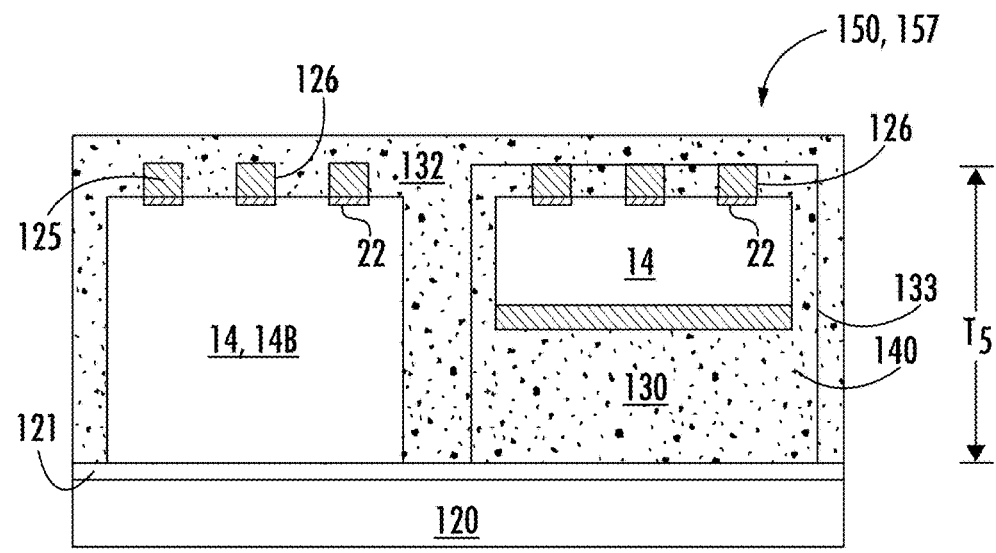

In the embodiment of FIG. 5F, depicted are subassembly 140, comprising component 14, and second component 14*b* after an encapsulation process comprising disposing an encapsulant 132 as a single layer of material over or around at least five surfaces of the second component 14*b* and over and around the conductive studs 125, including at least a portion of the sidewalls 126 of the second component 14*b*. The encapsulation process of FIG. 5F further comprises disposing a second encapsulant 132 over or around at least six surfaces comprising the outer surfaces 142 of the subassembly 140, comprising component 14, to form an electronic assembly 150 comprising a multi-encapsulant assembly 157. In one embodiment, the encapsulant 130 and second encapsulant 132 of the multi-encapsulant assembly 157 may comprise the same encapsulant, while in other embodiments, the encapsulants may be different. Even if the encapsulant 130 and second encapsulant 132 comprise the same encapsulant, a boundary 133 nonetheless will be formed between the outer surface 142 of the subassembly 140 and second encapsulant 132 as part of a first encapsulation process where encapsulant 130 is subjected to a curing process, and as part of a second encapsulation process where second encapsulant 132 is subject to a later curing process.

Figure 5G:
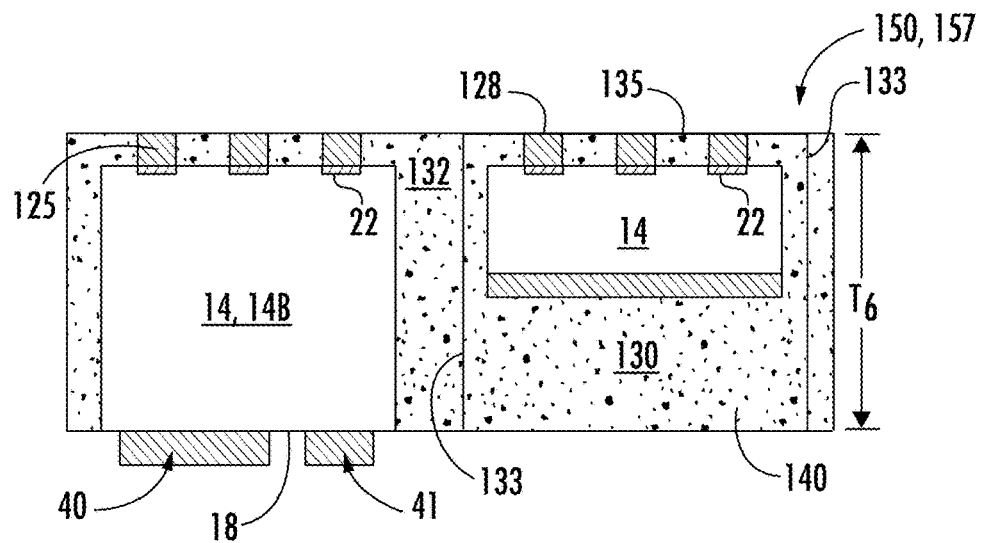

FIG. 5G, continuing from FIG. 5F, illustrates a cross-sectional view of the electronic assembly 150 comprising the multi-encapsulant assembly 157 where a topgrind to a thickness $T_6$ of encapsulants 132 and 130 has occurred. In this embodiment, the grinding exposes outer surfaces 128 of the conductive studs 125 and reduces the thickness of the multi-encapsulant assembly 157 to form the frontside planar surface 135. The frontside planar surface 135 comprises a planarized surface of encapsulant 130, a planarized surface of second encapsulant 132, and the outer surfaces 128 of the conductive studs 125. The frontside planar surface 135 may comprise a roughness less than 500 nanometers (nm) over a characteristic measurement distance. As further shown in FIG. 5G, the second thermal release tape 121 and second temporary carrier 120 have been debonded from the backside 18 of second component 14b and from subassembly 140. In this embodiment, conductive backside material 40 and second conductive backside material 41 have been formed on the backside 18 of component 14b.

FIGS. 6A to 6D illustrate various embodiments of the conductive backside material as disclosed herein. FIGS. 6A and 6B illustrate top or plan views of an electronic assembly 150 comprising two components 14a and 14b. As depicted in FIG. 6A, shown are first component 14a and second component 14b where, as shown here and in FIG. 1C, component 14a may comprise a pre-applied conductive backside material 48 disposed over the entirety of backside 18. Component 14b depicts backside 18 without a conductive backside material. As shown, component 14a comprises conductive backside material 48 disposed within footprint 70, and component 14b displays an exposed backside 18 within footprint 72.

FIG. 6B illustrates conductive backside material 40 covering the components 14a and 14b (illustrated by dashed lines). The component 14a on the left has conductive backside material 40 comprising an extended portion 162 extending beyond the edge 24 of the component 14a and comprising setback 160 (as also depicted in FIG. 4H) from the assembly ends 158. The component 14b on the right has conductive backside material 40 covering the surface of the component 14 without an extended portion 162 or setback 160. The conductive backside material 40 for each component 14 may be independently disposed, positioned, or arranged, so as to comprise one or more of: an extended portion 162 with respect to the component 14, a setback 160 or pullback with respect to the final electronic assembly 150, or neither.

FIG. 6C depicts top or plan views of an electronic assembly 150 comprising a first component 14a and a second component 14b. First component 14a depicts a conductive backside material 40 and a second conductive backside material 43 disposed over the conductive backside material 40 in a layered configuration on the backside 18 of first component 14a. Second component 14b comprises backside materials 40, 41 patterned into one or more portions over at least a portion of backside 18 and within a footprint 72 of the second component 14b.

FIG. 6D illustrates a cross-sectional view of an embodiment similar to FIGS. 6A, 6B and 6C, showing where component 14a comprises a pre-applied conductive backside material 48 and conductive backside material 40 disposed thereon, the conductive backside material 40 comprising extended portions 162 extending beyond a footprint of component 14a. Component 14b shows a conductive backside material 40 disposed within footprint 72 of component 14b.

FIG. 6E illustrates a cross-sectional view of the embodiment of FIG. 6D where the conductive backside material 40 comprises multiple portions, such as second conductive backside material 41 and third conductive backside material 42 as depicted in FIG. 4I.

Figure 6F:
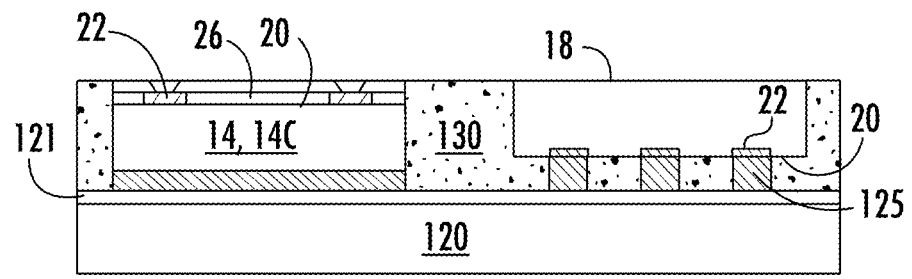
FIGS. 6F-6I illustrate embodiments of components with and without conductive studs disposed in face up and face down configurations, comprising multiple portions of conductive materials disposed on the components of FIGS. 1A-1C.
Figure 6G:
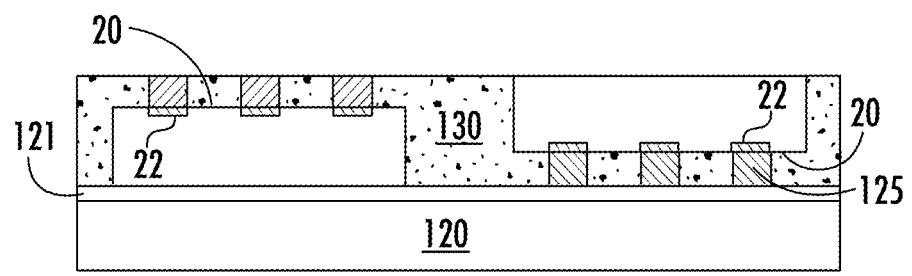

FIGS. 6F and 6G illustrate various embodiments of an electronic assembly 150 comprising a first component 14a in a face up configuration, and a second component 14b in a face down configuration.

FIG. 6F shows a cross-sectional view in which the first component 14, 14c does not comprise conductive studs 125 but instead comprises contact pads 22. Component 14c is depicted as disposed face up over second thermal release tape 121 and second temporary carrier 120, with contact pads 22 coupled to front surface 20, the contact pads 22 exposed for wire bonding or other interconnects. Residual encapsulant 130 formed over contact pads 22 may be removed by laser ablation, thus allowing for subsequent electrical coupling to contact pads 22 of component 14, 14c using wirebonds or similar electrical interconnects. Further shown is second component 14a with conductive studs 125 disposed in a face down configuration over second thermal release tape 121 and second temporary carrier 120.

FIG. 6G illustrates two components 14a, each comprising conductive studs 125, with one component disposed face up over second thermal release tape 121 and second temporary carrier 120, and the second component disposed in a face down configuration over second thermal release tape 121 and second temporary carrier 120.

While the conductive backside materials as disclosed herein are good thermal conductors, they may also be good electrical conductors and are able to provide electrical connection to the back surface 18 of components 14. Accordingly, in some embodiments, the conductive backside materials 40 may be formed as electrodes. In other embodiments, it may be desirable to electrically connect not only to back surface 18, but also to front surface 20 of components 14. In such embodiments, the front surface 20 may comprise conductive frontside materials which may be formed as electrodes from similar materials and methods as disclosed for the conductive backside materials 40. In some embodiments, the conductive front side materials may be applied as one step of a wafer fabrication process. The conductive front side materials may benefit from having an increased thickness and may be specified as such within the wafer fabrication process before shipping to a packaging location. In other embodiments, the conductive front side materials may be applied as an additional layer at the packaging location to increase thickness of the front side materials for improved compatibility with the packaging process. Using either approach, it is desirable that the conductive front side materials comprise a thickness such that the conductive front side materials remain within the assembly 150 after the grinding process as part of the method as disclosed herein.

Figure 6H:
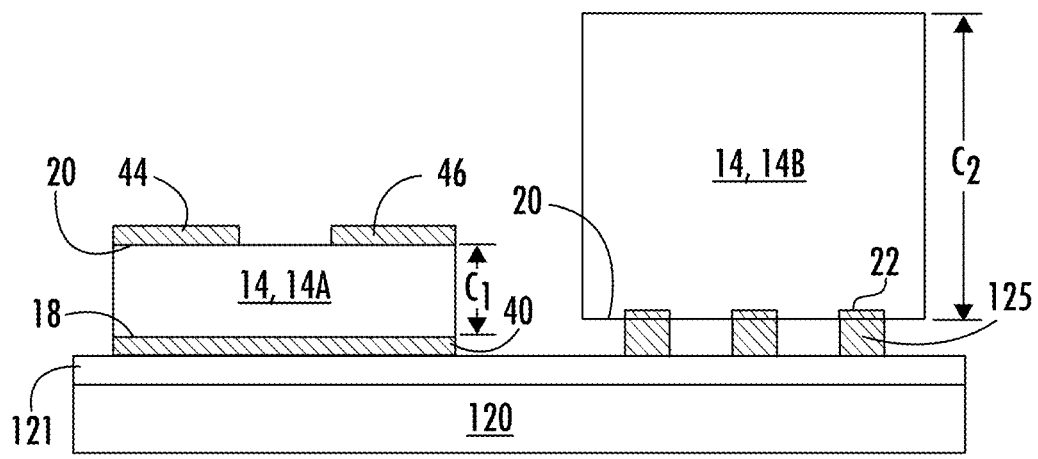

FIG. 6H illustrates first component 14a (which could also equally apply to second component 14b) disposed with a front surface 20 facing away from second thermal release tape 121 and second temporary carrier 120 in a face up configuration. Front surface 20 in this embodiment comprises a conductive frontside material 44, and a second conductive front surface material 46 disposed thereon. In the face up configuration as shown, where component 14a comprises a discrete transistor such as a MOSFET, an FET, a JFET, an IGBT, or a BJT, conductive frontside material 44 and second conductive frontside material 46 may comprise an emitter electrode, a gate or base electrode, or a source electrode. FIG. 6H further shows conductive backside material 40 which, where component 14a comprises a discrete transistor such as a MOSFET, an FET, a JFET, an IGBT, or a BJT, the conductive backside material 40 may comprise a drain or collector electrode. Where component 14a comprises a power diode, conductive frontside material 44 or second conductive frontside material 46 may comprise a cathode and conductive backside material 40 may comprise an anode. Disposing component 14a as depicted in FIG. 6H facilitates electrical coupling with front surface 20 and backside 18 of component 14a by wirebonds, contact clips, bond fingers of a leadframe, or other similar interconnects.

Figure 6I:
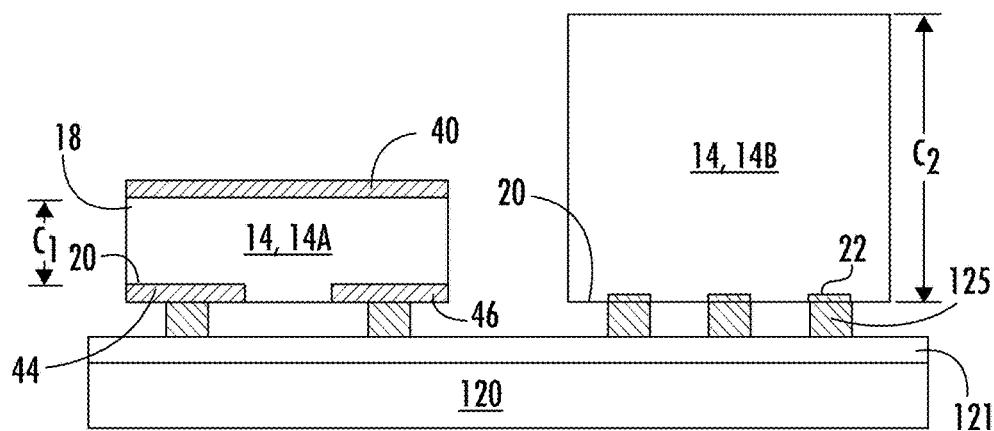

FIG. 6I shows the assembly of FIG. 6H where component 14a has been flipped so that component 14a is disposed with front surface 20 facing towards second thermal release tape 121 and second temporary carrier 120 in a face down configuration. The front surface 20 of component 14a is coupled to frontside conductive materials 44 and 46 in a similar manner as in FIG. 6H, but here conductive studs 125 are coupled to frontside conductive materials 44 and 46.

While in FIGS. 6H and 6I two conductive frontside materials 44, 46 are shown, one skilled in the art will appreciate that a single conductive frontside material, or two or more conductive frontside materials, are contemplated. One skilled in the art would further appreciate that more than one backside material may be included in a same or similar manner.

The assemblies of FIGS. 6H and 6I may be encapsulated and background as shown and discussed with respect to FIGS. 3D and 3E (showing different component thicknesses) and FIGS. 4B-4C (depicting similar component thicknesses), to reduce thickness $C_2$ of component 14b and expose frontside conductive materials 44 or 46 of component 14a as shown in FIG. 6H, or expose conductive backside material 40, as shown in FIG. 6I.

In some embodiments, the conductive backside materials as disclosed herein may comprise electrodes and may subsequently be connected by way of wire bonds or clips using any of contact pads 22, conductive backside material 40, second conductive backside material 41, third conductive backside material 42, or combinations of these. In the case of a component 14 comprising a power MOSFET or JFET, any of the conductive backside material 40, second conductive backside material 41, or third conductive backside material 42 may comprise a source electrode, a drain electrode, or a gate electrode. In alternate embodiments where component 14 comprises an IGBT, any of the conductive backside material 40, second conductive backside material 41, or third conductive backside material 42 may comprise an emitter electrode, a gate electrode, or a collector electrode. In embodiments where component 14 comprises a power bipolar transistor, any of the conductive backside material 40, second conductive backside material 41, or third conductive backside material 42 may comprise an emitter electrode, a collector electrode, or a base electrode. In further embodiments where component 14 comprises a diode, any one of the conductive backside material 40, second conductive backside material 41, or third conductive backside material 42 may comprise a cathode or an anode. In other embodiments comprising conductive studs 125, components 14 may be connected using conductive traces or conductive layers within a redistribution layer. Any combination of these interconnects may also be used dependent upon the package configuration.

The foregoing illustrations show two components 14 in the assembly. One skilled in the art will appreciate that a singular component 14 or a number of components 14 exceeding two may be processed in a same or similar manner and final electronic assemblies 150 may comprise one or more components 14.

Figure 7A:
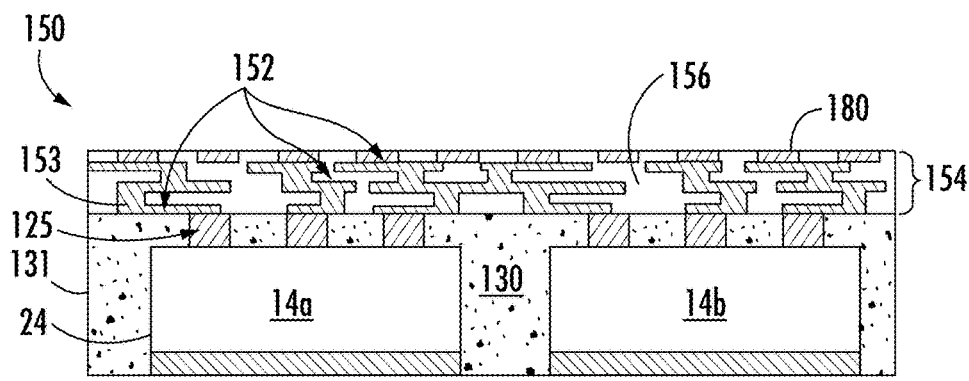
FIG. 7A shows a cross-sectional side or profile view of an electronic assembly comprising two components having a build-up interconnect structure disposed thereon.

Some electronic assemblies 150 further comprise forming conductive traces or redistribution layers (RDL) 152 (formed as part of an interconnect structure or build-up interconnect structure 154) coupled with the components and conductive studs 125, as shown in the cross-sectional side or profile view of FIG. 7A. In some embodiments, redistribution layers 152 as part of the build-up interconnect structure may electrically couple two or more components, such as components 14a and 14b, as shown in FIG. 7A. Build-up interconnect structures 154 may extend beyond an edge 24 of components 14a and 14b to an edge 131 of the electronic assembly 150. The electronic assembly 150 of FIGS. 7A and 8 further comprise input output (IO) pads 180 which may comprise land grid array (LGA) pads or pads for attachment of external package interconnects such as BGA solder balls and similar interconnects. At least a portion of the conductive traces 152 may be formed using unit specific patterning, which is also known under the trademark "Adaptive Patterning"®. Unit specific patterning or adaptive patterning is described, e.g., in U.S. Pat. No. 9,196,509, the entirety of which is hereby incorporated by reference herein. The cross-sectional side or profile view of FIG. 7A depicts an electronic assembly 150 after singulation from panel 134 and performing a backgrind process to remove encapsulant 130 and expose conductive backside material 40.

Figure 7B:
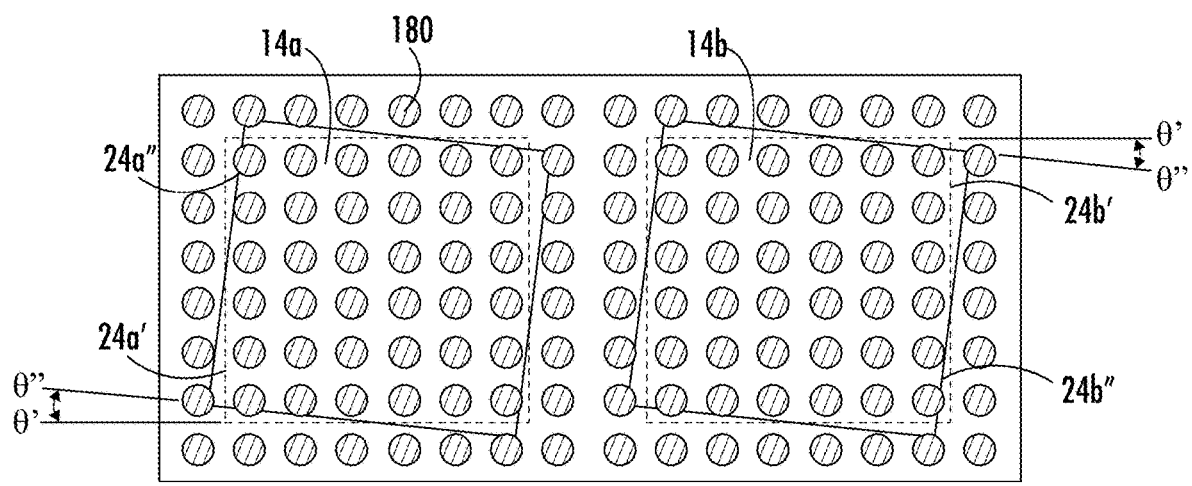
FIG. 7B depicts a plan view of a unit specific pattern for the build-up interconnect structure of the electronic assembly shown in FIG. 7A.
Figure 7C:
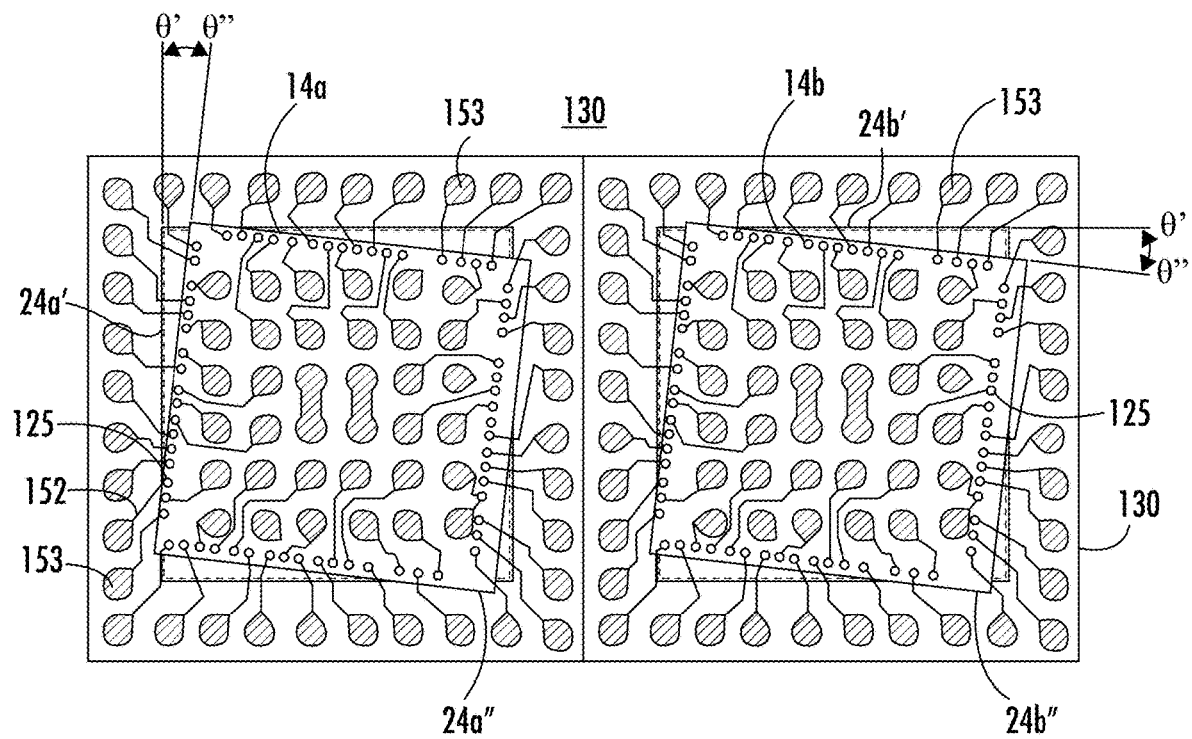
Figure 8:
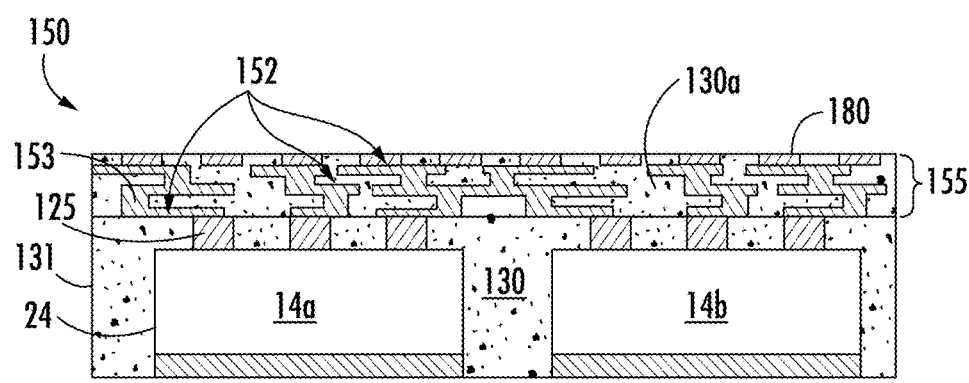
FIG. 8 shows a cross-sectional side or profile view of an electronic assembly similar to that of FIG. 7A, but differs from FIG. 7A in that the build-up interconnect structure comprises a molded direct contact interconnect structure.

The conductive traces 152 may be formed comprising multiple layers, such as part of a build-up interconnect structure 154 or interconnect structure. Plan views of various aspects of the electronic assembly 150 shown in FIG. 7A are shown in FIGS. 7B and 7C, where additional detail of the unit specific pattern is shown, including for the interconnect structure 154). In some instances, the interconnect structure will comprise alternating (or interleaved) layers of conductive material 152 (for the traces or RDL) and insulating layers 156 to form a build-up interconnect structure 154 as shown in FIG. 7A. In some instances, the build-up interconnect structure 154 comprises a molded direct contact interconnect structure 155 comprising insulating layers 156 formed of layers of mold compound or encapsulant, such as part of molded direct interconnect structures 155 as depicted in FIG. 8. In other instances, insulating layers 156 of insulating, passivating, or dielectric material may be used on, around, or above the conductive traces 152, including e.g., polyimide.

As indicated above, FIG. 7B provides a plan view of the electronic assembly 150 shown in FIG. 7A, and provides additional detail of the unit specific pattern for the interconnect structure 154. FIG. 7B illustrates that an initial edge 24a' of the component 14a, and an initial edge 24b' of the component 14b, may be moved (such as by an x-y shift or a rotation from ø' to ø") to a new edge position 24a" and 24b", respectively. The movement of the components 14a and 14b and the edge positions 24a" and 24b", respectively may mean that corresponding adjustments to the interconnect structure 154 to account for the movement are also desirable.

FIG. 7C, included below, provides a top view or plan view of the electronic assembly 150. Electronic assembly 150 comprises the interconnect structure 154 (comprising conductive traces 152 and conductive pads 153) formed over components 14a and 14b and over the encapsulant 130. FIG. 7C also shows how the unit specific pattern for the interconnect structure 154 can account for movement of the components 14, such that as a result of unit specific patterning, at least a portion of the conductive traces 152 may comprise a misalignment less than an average misalignment for the conductive traces 152.

Accordingly, unit specific patterning may be supplied to an inspection tool, which measures a position of a plurality components 14 on the panel and creates a file containing the measured position of each of the components 14. Design software then creates a pattern design file for each of the plurality of components 14 based upon the measured position of each of the plurality of components 14. A patterning machine imports the pattern design and creates a patterned feature (such as a portion of the interconnect structure 154) over each of the components 14. The panel 134 or reconstituted wafer is provided to the patterning machine from the inspection tool. A patterned pane may be output from the patterning machine. In an embodiment, the design software further creates a new drawing for at least one layer of the interconnect structure 154, which is adjusted or aligned to the measured position of each of the plurality of components 14. In an embodiment, the software includes an algorithm for unit specific patterning. For example, the algorithm may adjust the x-y position or orientation of a feature based upon a delta-value (angle ø, or a change in the angle ø). In an embodiment, the algorithm may select a feature pattern from a discrete number of design options based upon a delta-value. In an embodiment, the algorithm may dynamically design a feature based upon a delta-value.

FIG. 8, included below, illustrates another instance similar to that shown in FIG. 7A, but differs from FIG. 7A in that the build-up interconnect structure 154 from FIG. 7A is instead a molded direct contact interconnect structure 155 (also known under the trademark "MDx"™). The molded direct contact interconnect structure 155 may comprise one or more of the dielectric materials or layers of dielectric materials being formed of encapsulant 130. Further, the molded direct contact interconnect structure 155 can include direct contact with electrically conductive studs 125 without conventional vias being formed and used through one or more encapsulant layers 130a, which may be similar or identical to encapsulant 130. In some embodiments, redistribution layers 152 as part of the molded direct contact interconnect structure 155 may electrically couple two or more components, such as components 14a and 14b, as shown in FIG. 8. The molded direct contact interconnect structure 155 can be made or used as described in: (i) USP application Ser. No. 17/957,683, filed Sep. 30, 2022, titled "Quad Flat No-Lead (QFN) Package Without Leadframe and Direct Contact Interconnect Build-Up Structure;" and (ii) USP App. No. 63/480,094, filed Jan. 16, 2022, titled "Stacked Molded Direct Contact and Dielectric Structure and Method for Making the Same;" both of which are hereby incorporated by reference in their entireties. The cross-sectional side or profile view of FIG. 8, similar to that of FIG. 7A, depicts an electronic assembly 150 after a backgrind process to remove encapsulant 130 and expose conductive backside material 40.

While this disclosure includes a number of embodiments in different forms, the particular embodiments presented are with the understanding that the present disclosure is to be considered as an exemplification of the principles of the disclosed structures, devices, methods, and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making an electronic assembly, comprising:
   providing a temporary carrier;
   providing a first component with conductive studs coupled to a front surface of the first component, and coupling the first component face down and directly contacting the temporary carrier, the first component comprising a first thickness in a range of 10-300 micrometers (μm);
   providing a second component with conductive studs coupled to a front surface of the second component, and coupling the second component face down and directly contacting the temporary carrier, the second component comprising a second thickness greater than the first thickness, the second thickness being in a range of 10-800 μm;
   disposing an encapsulant as a single layer of material over or around at least five surfaces of the first component, over or around at least five surfaces of the second component, and around at least a portion of sidewalls of the conductive studs;
   removing a portion of the encapsulant to expose a backside of the second component or the first component and the second component;
   forming a conductive backside material comprising a thickness in a range of 1-1500 μm over at least a portion of one or more of a backside of the first component or over at least a portion of a backside of the second component, wherein the conductive backside material provides one or more benefits to the first component or the second component, including:
   heat dissipation, heat conduction, shielding, power, ground, electrical performance, electrical contact, electrical conduction, or structural reinforcement;
   forming a build-up interconnect structure over the front surfaces of the first and second components and over the single layer of encapsulant and directly contacting the conductive studs, after removing the temporary carrier.

2. The method of claim 1, further comprising disposing the encapsulant over or around at least six surfaces of the first component or over or around at least five surfaces of the second component.

3. The method of claim 1, wherein the conductive backside material is at least one of a good electrical conductor, a good thermal conductor, or both, and comprises one or more layers of metal, including: copper, aluminum, nickel, vanadium, silver, gold, brass, tungsten, molybdenum, other suitable metal, graphite, graphene, carbon nanotubes (CNTs), other suitable carbon materials, indium tin oxide (ITO), conductive polymers, diamond-like carbon (DLC), glass, and ceramics.

4. The method of claim 1, wherein the conductive backside material comprises a single portion that extends over:
   at least a portion of the backside of the first component;
   at least a portion of the backside of the second component; and
   at least a portion of the single layer of encapsulant disposed around the first component and the second component.

5. The method of claim 1, wherein the conductive backside material is applied:
   after the encapsulant is disposed over or around at least four surfaces of the first component and over or around at least four surfaces of the second component; and
   after removing a portion of the encapsulant to expose a backside of the first component or the second component.

6. The method of claim 1, further comprising disposing the conductive backside material before the encapsulant is disposed over or around the first component and before the encapsulant is disposed over or around the second component.

7. The method of claim 1, wherein the conductive backside material extends beyond one or more of a footprint of the first component and a footprint of the second component.

8. The method of claim 1, wherein:
   the first component comprises a diode, a transistor, a power transistor, a field-effect transistor (FET), a junction field-effect transistor (JFET), a metal-oxide-semiconductor field-effect transistor (MOSFET), a bipolar junction transistor (BJT), an insulated-gate bipolar transistor (IGBT), a static induction transistor (SIT), a Schottky transistor; and
   the second component comprises a processor, power management IC (PMIC) or logic device.

9. The method of claim 1, wherein the conductive backside material is configured to be electrically connected or electrically isolated from one or both of the first component and the second component.

10. A method of making an electronic assembly, comprising:
    providing a temporary carrier;
    disposing a first component over and directly contacting the temporary carrier, the first component comprising a first thickness;
    disposing a second component over and directly contacting the temporary carrier, the second component comprising a second thickness;
    disposing an encapsulant as a single layer of material over or around at least four surfaces of the first component and over or around at least four surfaces of the second component;
    removing a portion of the encapsulant to expose a backside of the first component or the second component; and
    forming a conductive backside material disposed over at least a portion of one or more of a backside of the first component or over at least a portion of a backside of the second component.

11. The method of claim 10, wherein at least one of the first component and the second component comprise conductive studs formed over a front surface of at least one of the first component and the second component.

12. The method of claim 10, wherein at least one of the first component and the second component is disposed over the temporary carrier in a face up configuration or in a face down configuration.

13. The method of claim 10, further comprising forming conductive traces as part of a build-up interconnect structure coupled with the first component and the second component, wherein at least a portion of the build-up interconnect structure comprises unit specific patterning such that a misalignment between the build-up interconnect structure and input output pads is less than a misalignment between an edge of the electronic assembly and the edge of one or more of the first component and the second component.

14. The method of claim 10, further comprising disposing the encapsulant over or around at least one of: five surfaces of the first component and at least five surfaces of the second component, and six surfaces of the first component or five surfaces of the second component.

15. The method of claim 10, wherein the conductive backside material comprises a single portion that extends over:
    at least a portion of the backside of the first component;
    at least a portion of the backside of the second component; and
    at least a portion of the single layer of encapsulant disposed around the first component and the second component.

16. The method of claim 10, wherein the conductive backside material is applied:
    after the encapsulant is disposed over or around at least four surfaces of the first component and over or around at least four surfaces of the second component; and
    after removing a portion of the encapsulant to expose a backside of the first component or the second component.

17. The method of claim 10, further comprising disposing the conductive backside material before the encapsulant is disposed over or around the first component and the second component.

18. The method of claim 10, wherein the conductive backside material comprises:
    a first portion of the conductive backside material formed within a footprint of the first component; and
    a second portion of the conductive backside material formed within a footprint of the second component.

19. The method of claim 10, wherein:
    the first component comprises a diode, a transistor, a power transistor, a field-effect transistor (FET), a junction field-effect transistor (JFET), a metal-oxide-semiconductor field-effect transistor (MOSFET), a bipolar junction transistor (BJT), an insulated-gate bipolar transistor (IGBT), a static induction transistor (SIT), a Schottky transistor; and
    the second component comprises a processor, power management IC (PMIC), or logic device.

20. The method of claim 10, wherein the conductive backside material is configured to be electrically connected or electrically isolated from one or both of the first component and the second component.

21. The method of claim 10, further comprising:
    the second thickness which is greater than the first thickness;
    the backside of the second component comprising a pre-applied backside metal;
    disposing the encapsulant over the pre-applied backside metal, and removing at least a portion of the encapsulant, thereby exposing the pre-applied backside metal.

* * * * *